United States Patent
Obu et al.

(10) Patent No.: US 10,163,829 B2
(45) Date of Patent: Dec. 25, 2018

(54) COMPOUND SEMICONDUCTOR SUBSTRATE AND POWER AMPLIFIER MODULE

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Masahiro Shibata, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 15/833,098

(22) Filed: Dec. 6, 2017

(65) Prior Publication Data
US 2018/0240766 A1     Aug. 23, 2018

(30) Foreign Application Priority Data
Feb. 20, 2017 (JP) .................................. 2017-029169

(51) Int. Cl.
*H01L 23/00* (2006.01)
*H01L 23/31* (2006.01)
*H01L 29/20* (2006.01)

(52) U.S. Cl.
CPC .......... *H01L 24/05* (2013.01); *H01L 23/3157* (2013.01); *H01L 24/32* (2013.01);
(Continued)

(58) Field of Classification Search
CPC ..... H01L 24/05; H01L 24/32; H01L 23/3157; H01L 29/20
See application file for complete search history.

(56) References Cited

U.S. PATENT DOCUMENTS 6,184,064 B1 * 2/2001 Jiang ................. H01L 24/32
257/739
6,363,201 B2 * 3/2002 Sherrer ............... G02B 6/3636
385/137

(Continued)

FOREIGN PATENT DOCUMENTS

JP        S61-004430 U    1/1986
JP        S63-142640 A    6/1988
(Continued)

OTHER PUBLICATIONS

An Office Action mailed by Taiwanese Patent Office dated Jul. 4, 2018, which corresponds to Taiwanese Patent Application No. 106142956 and is related to U.S. Appl. No. 15/833,098, with English language translation.

*Primary Examiner* — Peniel M Gumedzoe
(74) *Attorney, Agent, or Firm* — Studebaker & Brackett PC

(57) ABSTRACT

A compound semiconductor substrate has a first main surface parallel to a first direction and a second direction perpendicular to the first direction, a second main surface located on a side opposite to the first main surface, and a recess. The recess has an opening, a bottom surface facing the opening, and a plurality of side surfaces located between the opening and the bottom surface. The side surfaces include at least one first side surface forming an angle of about θ degrees with the bottom surface in the recess and at least one second side surface forming an angle of about φ degrees with the bottom surface in the recess. The total length of edge lines between the first main surface and the at least one first side surface is larger than that of edge lines between the first main surface and the at least one second side surface.

20 Claims, 30 Drawing Sheets

(52) U.S. Cl.
CPC .... *H01L 29/20* (2013.01); *H01L 2224/04026* (2013.01); *H01L 2224/05011* (2013.01); *H01L 2924/1424* (2013.01); *H01L 2924/35121* (2013.01)

(56) References Cited

U.S. PATENT DOCUMENTS

| | | | | |
|---|---|---|---|---|
| 6,858,471 | B1* | 2/2005 | Korec | H01L 29/0657 257/E29.022 |
| 8,058,732 | B2* | 11/2011 | Gruenhagen | H01L 23/3114 257/698 |
| 8,598,035 | B2* | 12/2013 | Gruenhagen | H01L 23/49513 257/341 |
| 9,431,316 | B2* | 8/2016 | Pagaila | H01L 21/565 |
| 9,543,384 | B2* | 1/2017 | Bae | H01L 23/145 |
| 9,613,888 | B2* | 4/2017 | Yoneyama | H01L 23/4952 |
| 2005/0067716 | A1* | 3/2005 | Mishra | H01L 21/8252 257/778 |
| 2013/0093072 | A1* | 4/2013 | Zhang | H01L 23/49503 257/676 |

FOREIGN PATENT DOCUMENTS

| | | |
|---|---|---|
| JP | S63-178342 U | 11/1988 |
| JP | 2013120824 A | 6/2013 |
| TW | 201507077 A | 2/2015 |

\* cited by examiner

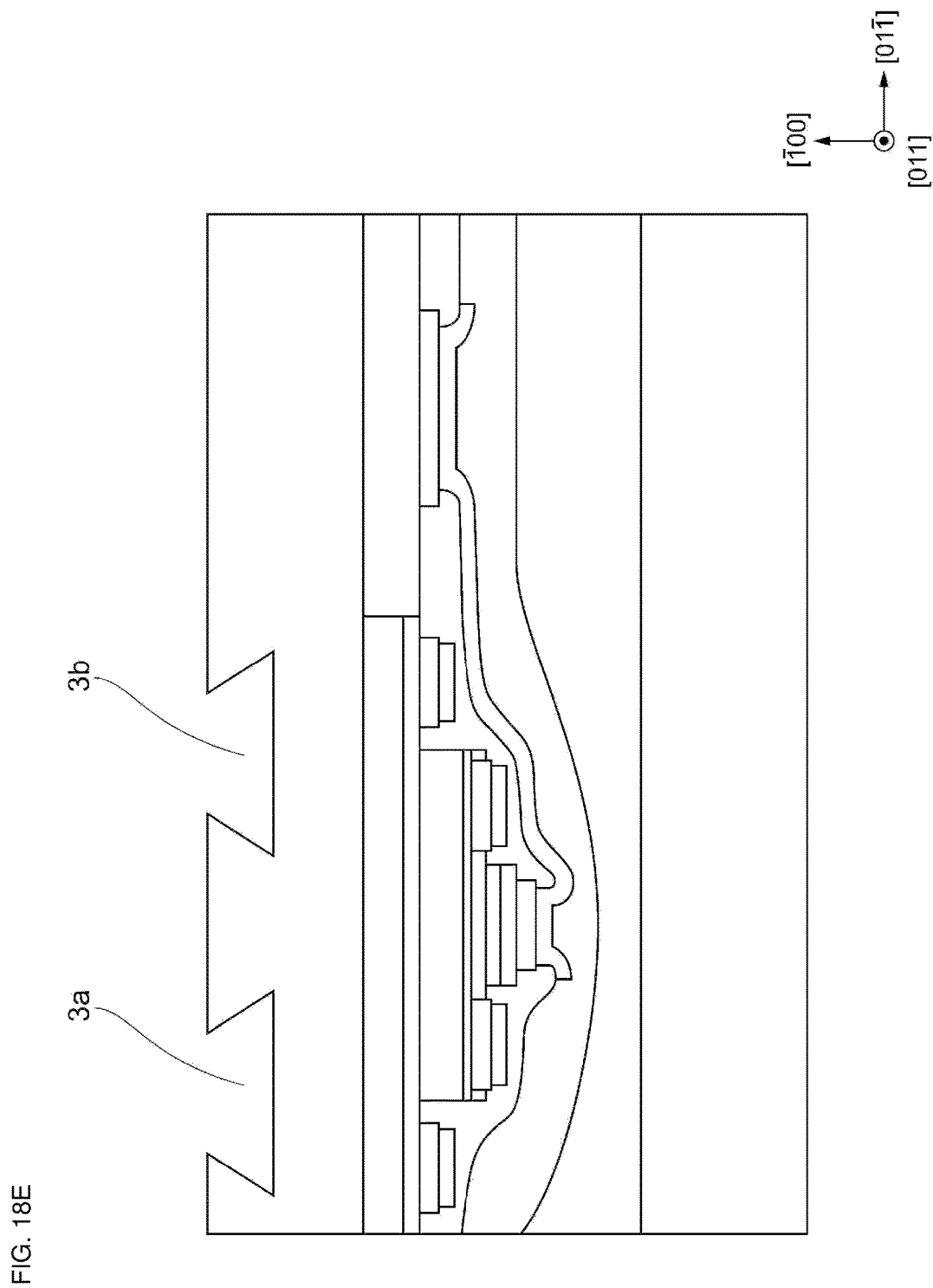

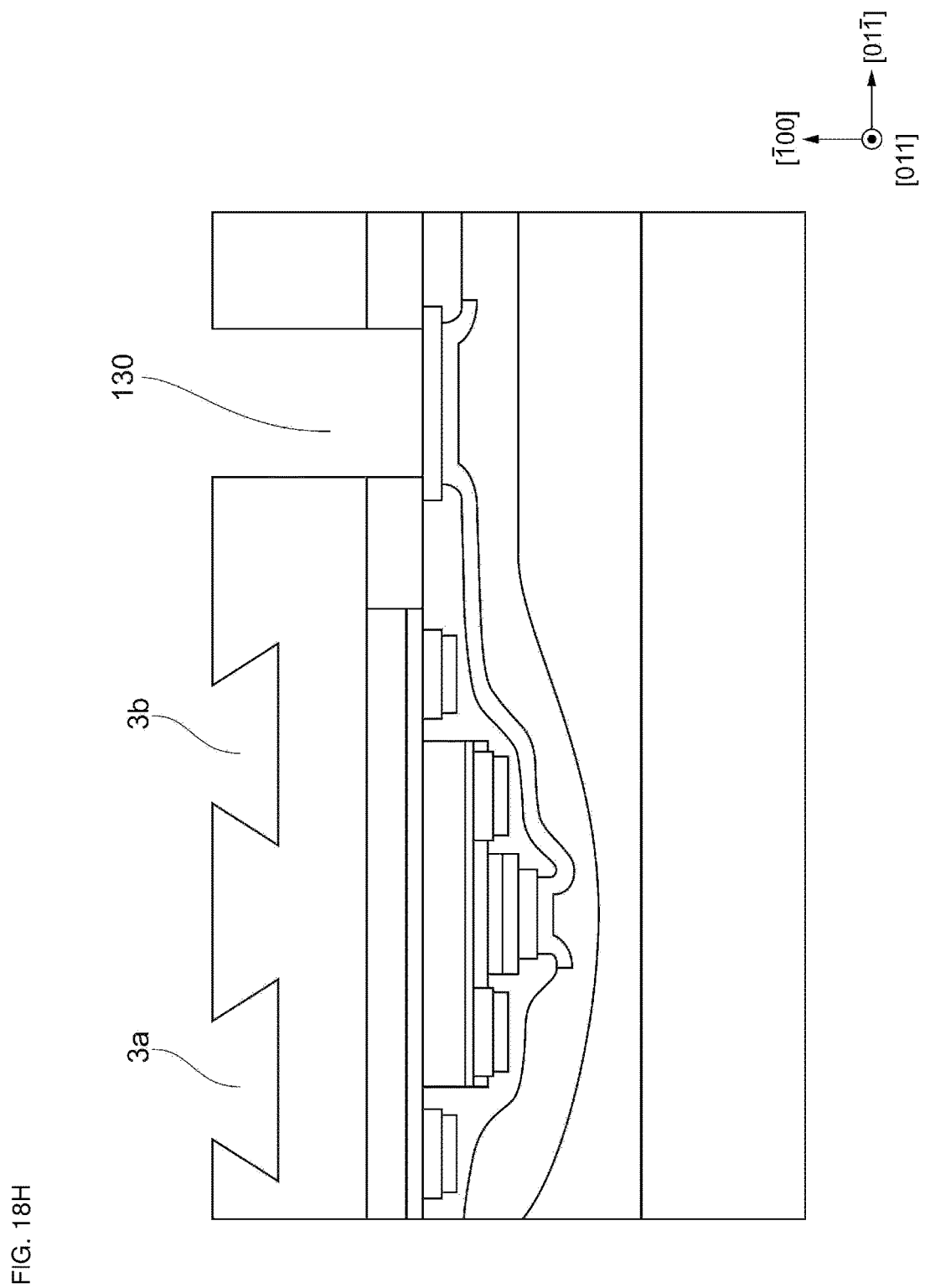

COMPOUND SEMICONDUCTOR SUBSTRATE AND POWER AMPLIFIER MODULE

CROSS REFERENCE TO RELATED APPLICATIONS

This application claims benefit of priority to Japanese Patent Application 2017-029169 filed Feb. 20, 2017, the entire content of which is incorporated herein by reference.

TECHNICAL FIELD

The present disclosure relates to a compound semiconductor substrate and a power amplifier module.

BACKGROUND

Compound semiconductor devices are generally used in power amplifier modules included in mobile communication devices such as cellular phones. Compound semiconductor devices have been required to have higher reliability. For example, characteristic variations during high-temperature reflow after moisture absorption in a high-temperature and high-humidity environment need to be suppressed. In such a high-temperature and high-humidity environment, a compound semiconductor chip is unfavorably separated from a module substrate. To address this problem, for example, Japanese Unexamined Utility Model Registration Application Publication No. 61-4430 discloses a structure in which a recess is formed on a back side of a silicon semiconductor chip and the recess is filled with an adhesive, thereby bonding the silicon semiconductor chip to a stage of a container. In this structure, the recess has a pot-like shape in which the inside is larger than the opening, and thus the bonding strength with a substrate is improved.

SUMMARY

However, the structure disclosed in Japanese Unexamined Utility Model Registration Application Publication No. 61-4430 relates to a silicon semiconductor chip, and a structure with consideration of the characteristics of compound semiconductors is not studied.

Accordingly, it is an object of the present disclosure to provide a compound semiconductor substrate whose peeling resistance is improved.

According to preferred embodiments of the present disclosure, a compound semiconductor substrate includes a first main surface parallel to a first direction and a second direction perpendicular to the first direction, a second main surface located on a side opposite to the first main surface, and a recess formed from the first main surface toward the second main surface. The recess has an opening formed in the first main surface, a bottom surface facing the opening, and a plurality of side surfaces located between the opening and the bottom surface so as to define the recess. The plurality of side surfaces include at least one first side surface that extends in the first direction and forms an angle of about θ (0<θ<90) degrees with the bottom surface in the recess and at least one second side surface that extends in the second direction and forms an angle of about φ (90<φ<180) degrees with the bottom surface in the recess. A total length of edge lines between the first main surface and the at least one first side surface is larger than a total length of edge lines between the first main surface and the at least one second side surface.

According to the present disclosure, a compound semiconductor substrate whose peeling resistance is improved can be provided.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 18E illustrates the procedure of a production method of the compound semiconductor chip according to another modification of the first embodiment of the present disclosure.

FIG. 18H illustrates the procedure of a production method of the compound semiconductor chip according to another modification of the first embodiment of the present disclosure.

DETAILED DESCRIPTION

Hereafter, embodiments of the present disclosure will be described. In the following description of the drawings, the same or similar constituent elements will be denoted by the same or similar symbols. The drawings are exemplary, the dimensions and shapes of the individual parts are schematic, and the technical scope of the present disclosure should not be interpreted as being limited to that of the embodiments.

Figure 1:
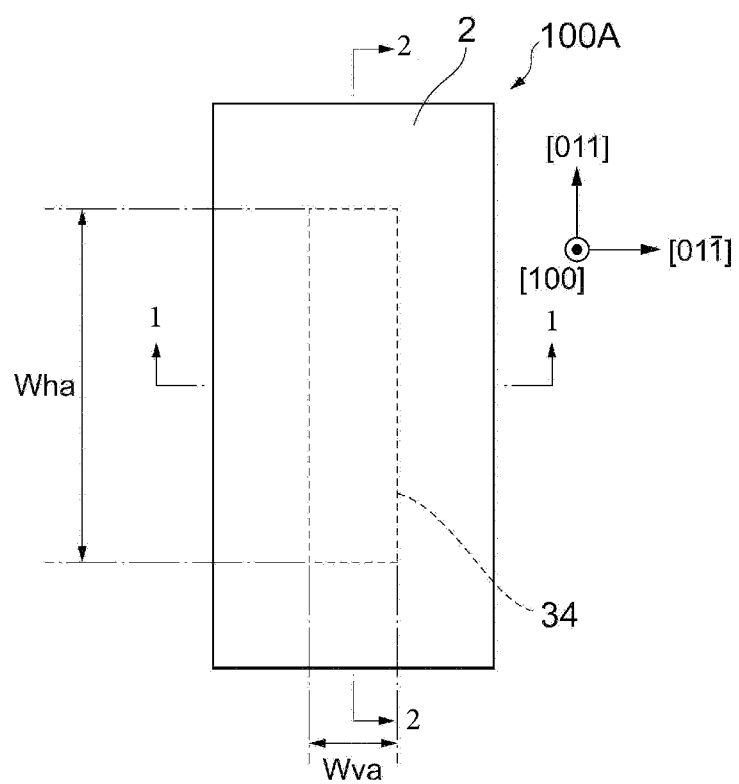
FIG. 1 is a plan view of a compound semiconductor chip according to a first embodiment of the present disclosure.
Figure 2:
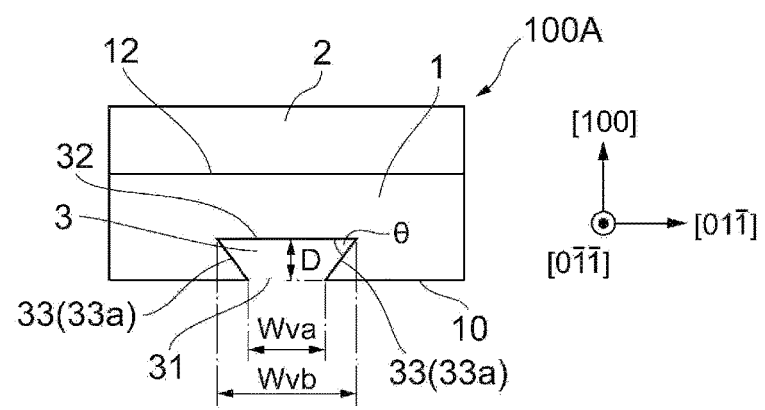
FIG. 2 is a sectional view taken along line 1-1 in FIG. 1.
Figure 3:
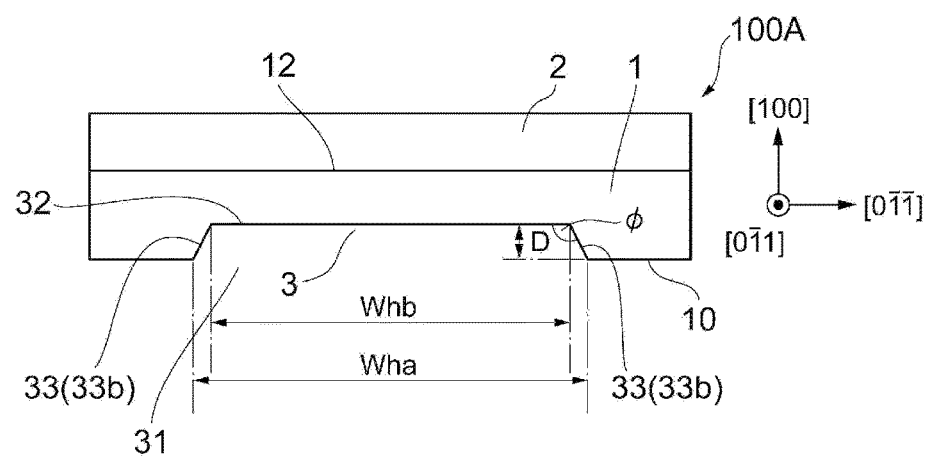
FIG. 3 is a sectional view taken along line 2-2 in FIG. 1.

First, a compound semiconductor chip according to a first embodiment of the present disclosure will be described with reference to FIG. 1 to FIG. 8B. FIG. 1 is a plan view of a compound semiconductor chip according to a first embodiment of the present disclosure. FIG. 2 is a sectional view taken along line 1-1 in FIG. 1. FIG. 3 is a sectional view taken along line 2-2 in FIG. 1. A compound semiconductor chip 100A according to this embodiment includes a compound semiconductor substrate 1 and a circuit formation region 2. In FIG. 1 to FIG. 3, the crystal orientation of the compound semiconductor substrate 1 is also illustrated. In this specification, the negative coordinate of the crystal orientation is expressed as "−1" without using an overline for convenience in writing. In the expression of the crystal orientation, the [011] direction is parallel to the [0-1-1] direction, but is opposite to the [0-1-1] direction. The [01-1] direction is parallel to the [0-11] direction, but is opposite to the [0-11] direction.

The compound semiconductor substrate 1 is formed of, for example, GaAs and includes long sides parallel to the [011] direction (first direction), short sides parallel to the [01-1] direction (second direction) perpendicular to the [011] direction, and a thickness parallel to the [100] direction in terms of the crystal orientation of GaAs. The compound semiconductor substrate 1 also includes a first main surface 10 that is parallel to the (100) plane and has a substantially rectangular shape and a second main surface 12 located on a side opposite to the first main surface 10. Hereafter, the structure of a compound semiconductor chip will be described on the basis of the crystal orientation. The plane orientation of the first main surface 10 and the second main surface 12 in the compound semiconductor substrate 1 may be within (100)±4 degrees. The material for the compound semiconductor substrate 1 is not limited to GaAs, and another compound semiconductor such as InP may be used.

The circuit formation region 2 is disposed on the second main surface 12 ([100] direction) of the compound semiconductor substrate 1. An active element such as a heterojunction bipolar transistor (HBT), a field effect transistor (FET), a high electron mobility transistor (HEMT), a laser diode, or a photodiode; a passive element such as a resistance element, a capacitance element, or an inductance element; or a wiring line, an interlayer insulating film, a passivation film, or the like is formed in the circuit formation region 2. An electric circuit is formed by combining the active element, the passive element, the wiring line, the insulating film, the passivation film, and the like.

In the compound semiconductor substrate 1, a recess 3 is formed from the first main surface 10 toward the second main surface 12 (i.e., in the [100] direction). The recess 3 has an opening 31 formed in the first main surface 10 of the compound semiconductor substrate 1, a bottom surface 32 facing the opening 31, and a plurality of side surfaces 33 located between the opening 31 and the bottom surface 32 so as to define the recess 3. The plurality of side surfaces 33 are constituted by a pair of side surfaces 33a (first side surfaces) extending in the [011] direction (first direction) and a pair of side surfaces 33b (second side surfaces) extending in the [01-1] direction (second direction). The broken line in FIG. 1 indicates edge lines 34 between the first main surface 10 of the compound semiconductor substrate 1 and the side surfaces 33a and 33b of the recess 3 (i.e., the shape of the opening 31).

As illustrated in FIG. 1, the edge lines 34 form a substantially rectangular shape. The length (Wha) of edge lines parallel to the [011] direction is larger than the length (Wva) of edge lines parallel to the [01-1] direction (refer to FIG. 1). In this embodiment, for example, Wva is 200 μm and Wha is 1000 μm. Therefore, in the recess 3, the total length (2×Wha) of the edge lines between the first main surface 10 and the side surfaces 33a is larger than the total length (2×Wva) of the edge lines between the first main surface 10 and the side surfaces 33b.

In the recess 3, the cross section taken along line 1-1 has a shape different from that of the cross section taken along line 2-2. Specifically, in the cross section taken along line 1-1, the angle θ formed by the bottom surface 32 and the side surface 33a inside the recess 3 is an acute angle (i.e., 0<θ<90) (refer to FIG. 2). That is, in the recess 3, the length Wvb of the bottom surface 32 in the [01-1] direction is larger than the length Wva of the opening 31 in the [01-1] direction. Hereafter, the side surfaces that form the cross-sectional shape of this recess are also referred to as "inverted mesa" side surfaces.

In the cross section taken along line 2-2, the angle φ formed by the bottom surface 32 and the side surface 33b inside the recess 3 is an obtuse angle (i.e., 90<φ<180) (refer to FIG. 3). That is, in the recess 3, the length Whb of the bottom surface 32 in the [0-1-1] direction is smaller than the length Wha of the opening 31 in the [0-1-1] direction. Hereafter, the side surfaces that form the cross-sectional shape of this recess are also referred to as "normal mesa" side surfaces.

The depth D (the distance from the opening 31 to the bottom surface 32 in the [100] direction) of the recess 3 is set to a depth smaller than or equal to the thickness of the compound semiconductor substrate 1. In this embodiment, for example, the thickness of the compound semiconductor substrate 1 is 75 μm and the depth D of the recess 3 is 20 μm. Next, a production process of the inverted mesa and normal mesa side surfaces of the recess 3 will be described with reference to FIG. 4A to FIG. 4E.

Figure 4A:
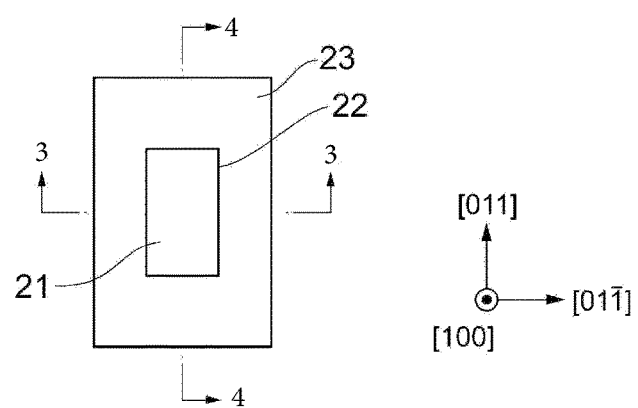
FIG. 4A is a diagram for describing a production process of a recess.
Figure 4B:
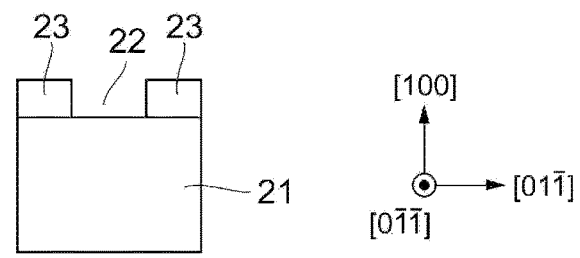
FIG. 4B is a diagram for describing a production process of the recess.
Figure 4C:
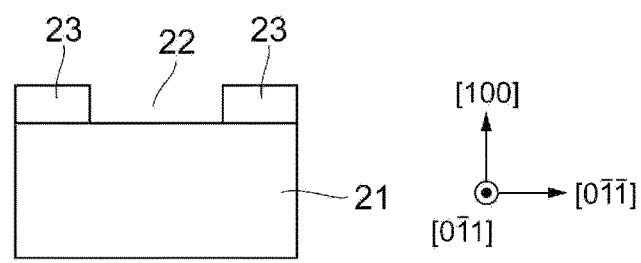
FIG. 4C is a diagram for describing a production process of the recess.

FIG. 4A to FIG. 4E are diagrams for describing the production process of the recess 3. FIG. 4B is a sectional view taken along line 3-3 in FIG. 4A, and FIG. 4C is a sectional view taken along line 4-4 in FIG. 4A. For convenience of description, the same symbols as those in FIG. 1 to FIG. 3 are used for the recess.

First, as illustrated in FIG. 4A to FIG. 4C, a photoresist 23 having a cavity 22 is formed on the compound semiconductor substrate 21. The cavity 22 of the photoresist 23 has a substantially rectangular shape with long sides parallel to the [011] direction and short sides parallel to the [01-1] direction. Wet etching is performed using the photoresist 23 as a mask to form a recess 3 under the cavity 22.

Figure 4D:
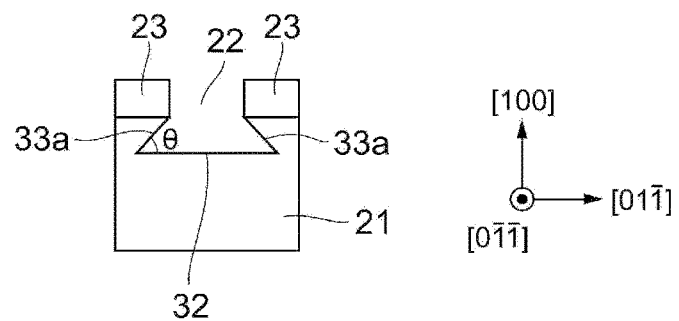
FIG. 4D is a diagram for describing a production process of the recess.
Figure 4E:
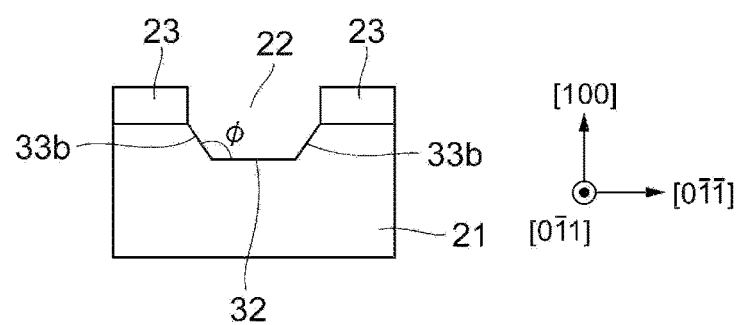
FIG. 4E is a diagram for describing a production process of the recess.

FIG. 4D and FIG. 4E are a sectional view taken along line 3-3 and a sectional view taken along line 4-4 after the wet etching, respectively. As a result of the wet etching, a portion of the compound semiconductor substrate 21 under the cavity 22 of the photoresist 23 is removed. Herein, a compound semiconductor is a material containing two or more kinds of atoms and exhibits crystal orientation dependence. For example, different electrochemical properties are exhibited depending on the crystal orientation, and thus different etching rates are provided. When the compound semiconductor substrate 21 is wet-etched, the compound semiconductor substrate 21 is not vertically removed along the cavity 22 of the photoresist 23, but is removed while inclinations based on the crystal orientation are formed. Specifically, the cross section parallel to the (0-1-1) plane has an inverted mesa shape in which the angle θ formed by the bottom surface 32 and the side surface 33a of the recess is an acute angle (refer to FIG. 4D). The angle θ is, for example, θ=54.7±4 degrees. On the other hand, the cross section parallel to the (0-11) plane has a normal mesa shape in which the angle φ formed by the bottom surface 32 and the side surface 33b of the recess is an obtuse angle (refer to FIG. 4E). The angle φ is, for example, φ=180−θ=125.3±4 degrees. As described above, since the cavity 22 of the photoresist 23 has long sides parallel to the [011] direction, the inverted mesa side surfaces 33a are formed so as to be longer than the normal mesa side surfaces 33b.

The inverted mesa side surfaces 33a can be formed by using the crystal orientation dependence of compound semiconductors without performing complicated processes. Furthermore, by controlling the shape of the cavity 22 of the photoresist 23, the recess 3 can be formed such that the inverted mesa side surfaces 33a are longer than the normal mesa side surfaces 33b.

Figure 5A:
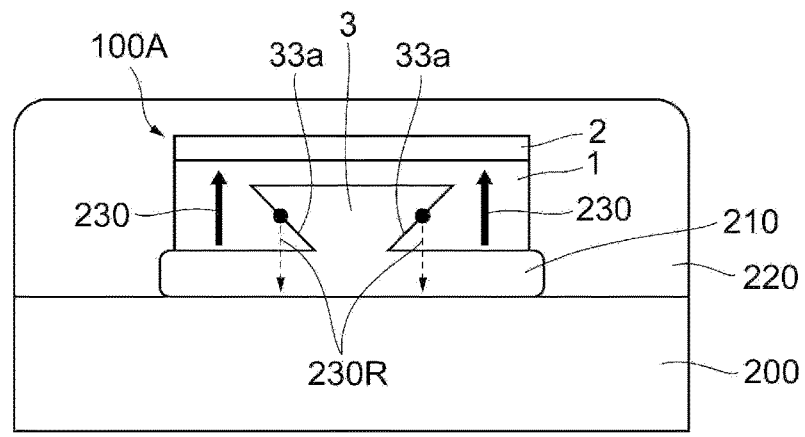
FIG. 5A is a sectional view of a module obtained by mounting a compound semiconductor chip according to the first embodiment of the present disclosure.
Figure 5B:
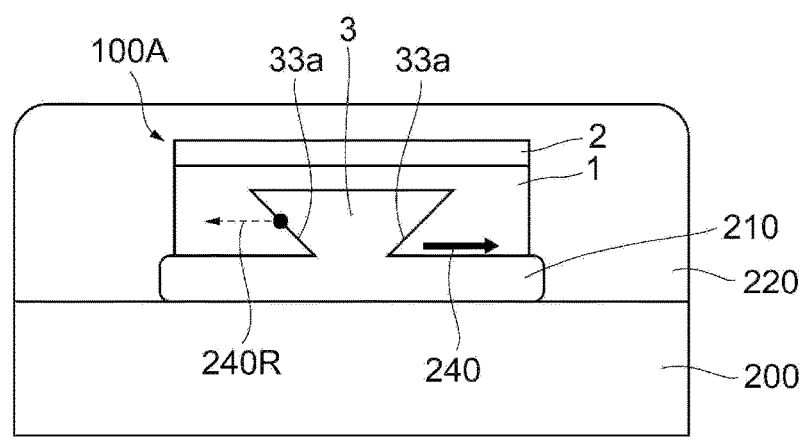
FIG. 5B is a sectional view of a module obtained by mounting a compound semiconductor chip according to the first embodiment of the present disclosure.
Figure 6A:
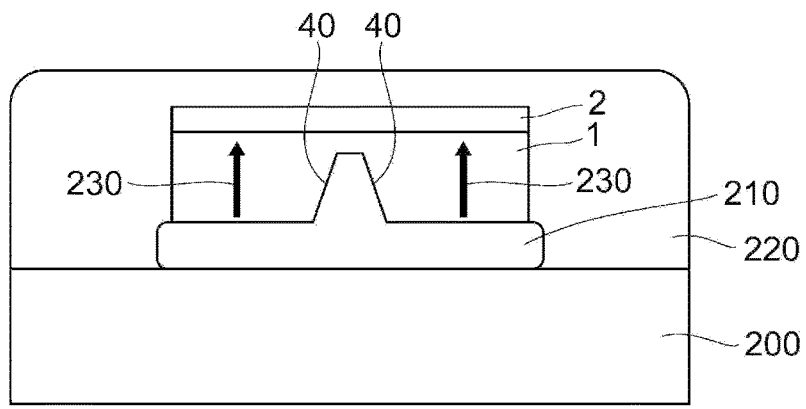
FIG. 6A is a sectional view of a module obtained by mounting a compound semiconductor chip in which a recess (Comparative Example A) is formed.
Figure 6B:
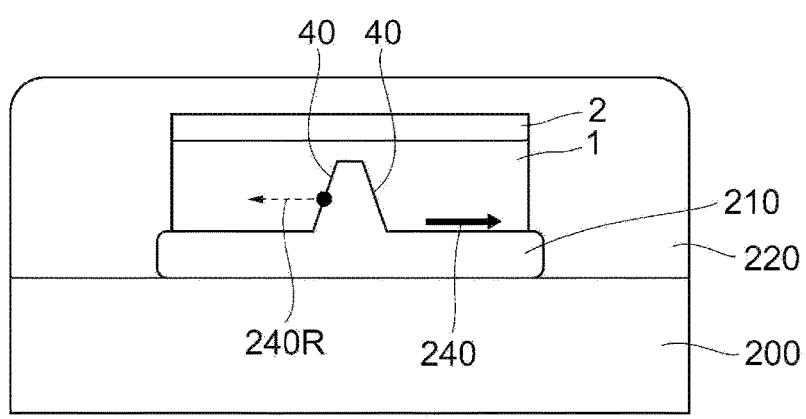
FIG. 6B is a sectional view of a module obtained by mounting a compound semiconductor chip in which a recess (Comparative Example A) is formed.
Figure 7A:
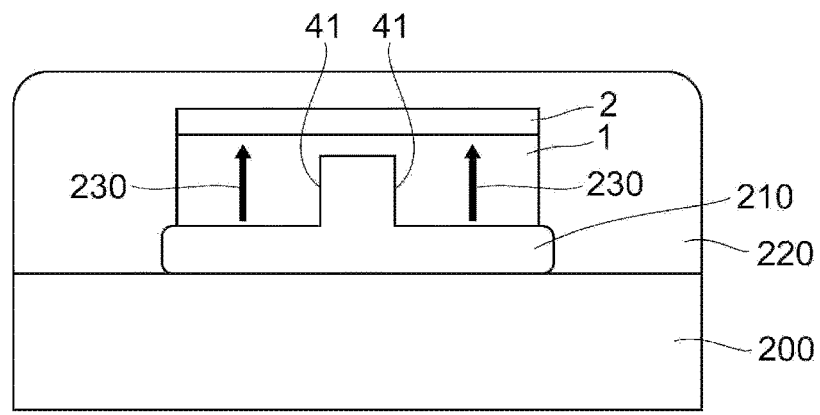
FIG. 7A is a sectional view of a module obtained by mounting a compound semiconductor chip in which a recess (Comparative Example B) is formed.
Figure 7B:
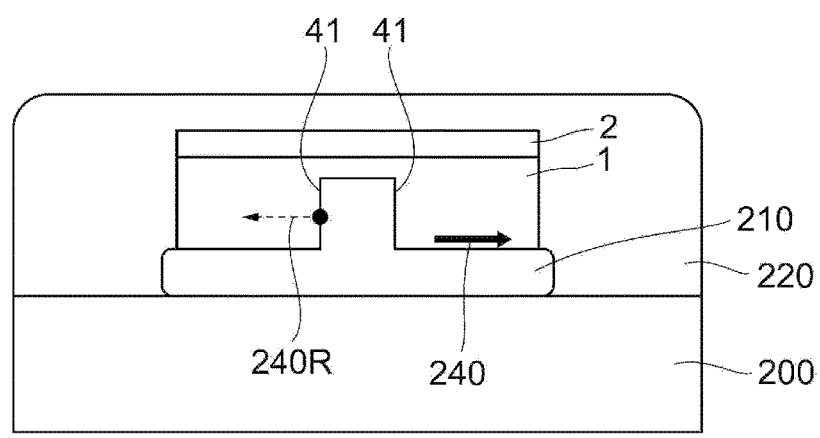
FIG. 7B is a sectional view of a module obtained by mounting a compound semiconductor chip in which a recess (Comparative Example B) is formed.

Next, the adhesive strength of the compound semiconductor chip according to this embodiment will be described with reference to FIG. 5A to FIG. 7B. FIG. 5A and FIG. 5B are sectional views each illustrating a module obtained by mounting the compound semiconductor chip according to the first embodiment of the present disclosure. FIG. 6A and FIG. 6B are sectional views each illustrating a module obtained by mounting a compound semiconductor chip in which a recess (Comparative Example A) is formed. FIG. 7A and FIG. 7B are sectional views each illustrating a module obtained by mounting a compound semiconductor chip in which a recess (Comparative Example B) is formed. The sectional views in FIG. 5A to FIG. 7B extend in the same direction as the sectional view of the compound semiconductor chip 100A taken along line 1-1 in FIG. 1.

In the module illustrated in FIG. 5A and FIG. 5B, the compound semiconductor chip 100A is bonded to a main surface of a module substrate 200 using an adhesive 210. The adhesive 210 is interposed between the compound semiconductor chip 100A and the module substrate 200, and the recess 3 formed in the compound semiconductor substrate 1 is filled with the adhesive 210. The compound semiconductor chip 100A is covered with a cured resin 220.

FIG. 6A and FIG. 6B each illustrate a structure (hereafter also referred to as Comparative Example A) in which the recess formed in the compound semiconductor substrate is a normal mesa recess. FIG. 7A and FIG. 7B each illustrate a structure (hereafter also referred to as Comparative Example B) in which the recess formed in the compound semiconductor substrate has side surfaces vertical to the bottom surface. The structures of the modules in FIG. 6A to FIG. 7B are the same as that of the module in FIG. 5A and FIG. 5B except for the recess. Therefore, the same symbols as those in FIG. 5A and FIG. 5B are used and the detailed descriptions thereof are omitted.

In FIG. 5A, FIG. 6A, and FIG. 7A, the main stress that causes separation of the compound semiconductor chip is assumed to be tensile stress (i.e., a force exerted from the first main surface 10 toward the second main surface 12 in the compound semiconductor substrate 1). In FIG. 5B, FIG. 6B, and FIG. 7B, the main stress that causes separation of the compound semiconductor chip is assumed to be shear stress (i.e., a force exerted in a direction perpendicular to the direction of the above tensile stress).

In the recess 3 illustrated in FIG. 5A, when tensile stress 230 is exerted on the compound semiconductor chip 100A, a physical wedge effect (or anchor effect) is produced because of the geometric shape of the recess 3. This generates an opposing force 230R in a direction opposite to the tensile stress 230 at interfaces between the side surfaces 33a of the recess 3 and the adhesive 210. In Comparative Example A illustrated in FIG. 6A or Comparative Example B illustrated in FIG. 7A, even when the tensile stress 230 is exerted on the compound semiconductor chip, such a physical wedge effect (or anchor effect) is not produced and thus an opposing force is not generated at interfaces between the side surfaces 40 and 41 of the recesses and the adhesive 210. As is clear from the above fact, the inverted mesa recess 3 increases the adhesive strength between the compound semiconductor substrate and the module substrate against tensile stress compared with the structure in Comparative Example A or Comparative Example B. Thus, the peeling resistance is improved.

In the recess 3 illustrated in FIG. 5B, when shear stress 240 is exerted on the compound semiconductor chip 100A, a physical wedge effect (or anchor effect) is produced because of the geometric shape of the recess 3. This generates an opposing force 240R in a direction opposite to the shear stress 240 at interfaces between the side surfaces 33a of the recess 3 and the adhesive 210. In Comparative Example A illustrated in FIG. 6B or Comparative Example B illustrated in FIG. 7B, when shear stress 240 is exerted on the compound semiconductor chip, an opposing force 240R is also generated at interfaces between the side surfaces 40 and 41 of the recesses and the adhesive 210 as in the case of the recess 3. As is clear from the above fact, the inverted mesa recess 3 has the same adhesive strength as that in the structure in Comparative Example A and Comparative Example B against shear stress.

The inverted mesa recess 3 has high adhesive strength for both the tensile stress and the shear stress, and thus high peeling resistance is achieved. In the compound semiconductor chip 100A, as described above, the recess 3 is formed such that the inverted mesa side surfaces 33a are longer than the normal mesa side surfaces 33b. This further increases the adhesive strength between the compound semiconductor substrate and the module substrate in the compound semiconductor chip 100A higher than in Comparative Example A or Comparative Example B. Thus, the peeling resistance is improved.

Figure 8A:
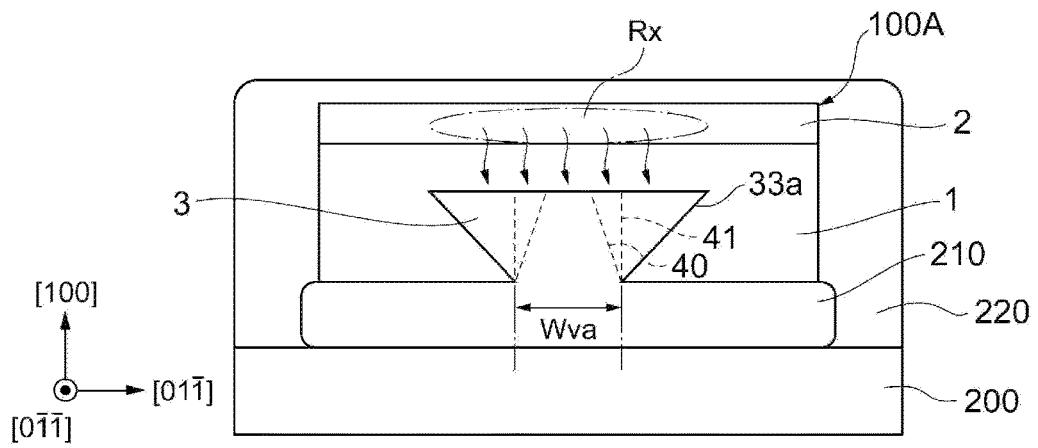
FIG. 8A is a sectional view of a module obtained by mounting the compound semiconductor chip according to the first embodiment of the present disclosure.
Figure 8B:
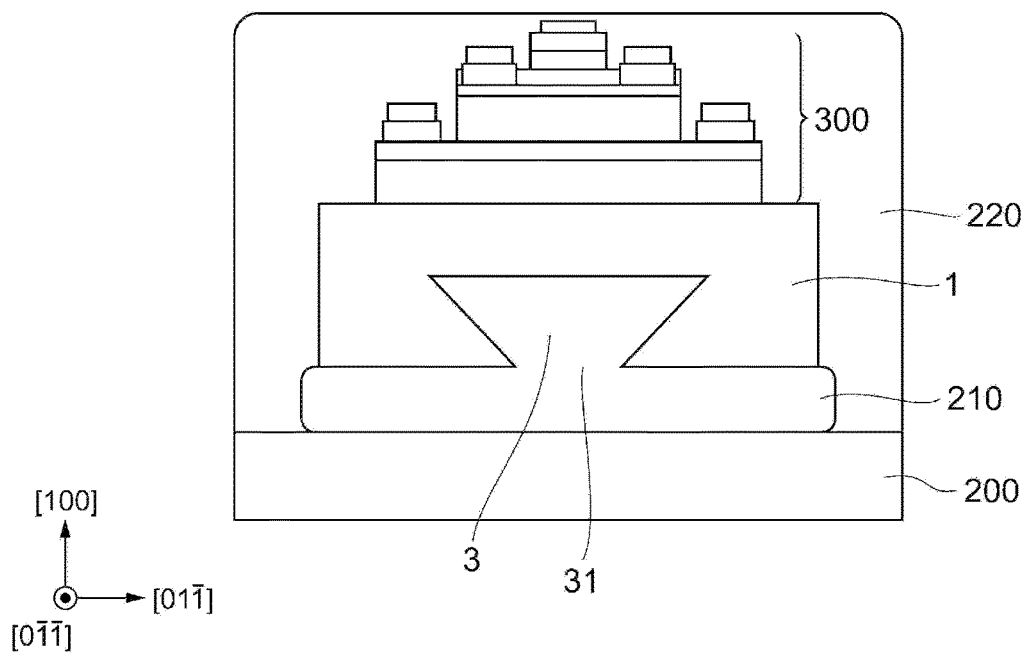
FIG. 8B is a sectional view of a module obtained by mounting a compound semiconductor chip in which a HBT is formed.

Next, the heat dissipation properties of the compound semiconductor chip according to this embodiment will be described with reference to FIG. 8A and FIG. 8B. FIG. 8A is a sectional view of a module obtained by mounting the compound semiconductor chip according to the first embodiment of the present disclosure. FIG. 8B is a sectional view of a module obtained by mounting a compound semiconductor chip in which a HBT is formed. The sectional views in FIG. 8A and FIG. 8B extend in the same direction as the sectional view of the compound semiconductor chip 100A taken along line 1-1 in FIG. 1.

FIG. 8A illustrates, in addition to the side surfaces 33a (solid line) of the recess 3, the side surfaces 40 (broken line) in Comparative Example A and the side surfaces 41 (broken line) in Comparative Example B. When the widths Wva of the openings of the recess 3, Comparative Example A, and Comparative Example B are assumed to be equal, the volume inside the recess (i.e., the volume of the adhesive 210 with which the inside of the recess is filled) is in the order of recess 3>Comparative Example B>Comparative Example A.

The adhesive 210 has higher thermal conductivity than the compound semiconductor substrate 1. For example, when the compound semiconductor substrate is formed of GaAs (thermal conductivity: about 46 W/mK), the thermal conductivity of the adhesive 210 is higher than 46 W/mK. The material for the adhesive 210 is not particularly limited, and may be, for example, a silver paste. The adhesive 210 may be electrically conductive or insulative.

The circuit formation region 2 of the compound semiconductor chip 100A includes a heat generation region Rx due to the electric circuit. Heat conducts from the heat generation region Rx toward the module substrate 200. Therefore, if the thermal conductivity of a material disposed under the heat generation region Rx ([−100] direction) is high, heat readily conducts to the module substrate 200, which facilitates the dissipation of heat generated by the electric circuit. In other words, when the thermal conductivity of the adhesive 210 is higher than that of the compound semiconductor substrate 1, the heat dissipation properties improve as the volume of the adhesive 210 in the compound semiconductor substrate increases. Therefore, better heat dissipation properties are achieved in descending order of the volume inside the recess, that is, in the order of recess 3>Comparative Example B>Comparative Example A. In other words, the heat dissipation properties of the compound semiconductor chip 100A mounted on the module substrate 200 are better than those in Comparative Example A or Comparative Example B.

The position at which the recess 3 is formed may be adjusted in accordance with the positioning of the electric circuit formed in the circuit formation region 2. For example, in the case where a HBT 300 (amplifying device) is formed in the circuit formation region 2 as illustrated in FIG. 8B, the HBT 300 generates a largest amount of heat around the center thereof in the [01-1] direction. Therefore, when the substantial center of the HBT 300 is located on the second main surface 12 of the compound semiconductor substrate 1 in a region corresponding to the opening 31 of the recess 3, the heat dissipation properties of the compound semiconductor chip are further improved.

As described above, in the compound semiconductor substrate 1, the recess 3 can be formed such that the inverted mesa side surfaces 33a are longer than the normal mesa side surfaces 33b by using the crystal orientation dependence. Thus, the compound semiconductor substrate 1 has higher adhesive strength between the compound semiconductor substrate and the module substrate than that in Comparative Example A or Comparative Example B without performing complicated processes, which can improve the peeling resistance. Furthermore, the compound semiconductor substrate 1 mounted on the module substrate has better heat dissipation properties than that in Comparative Example A or Comparative Example B because the volume of the adhesive with which the recess 3 is filled is increased.

Figure 9:
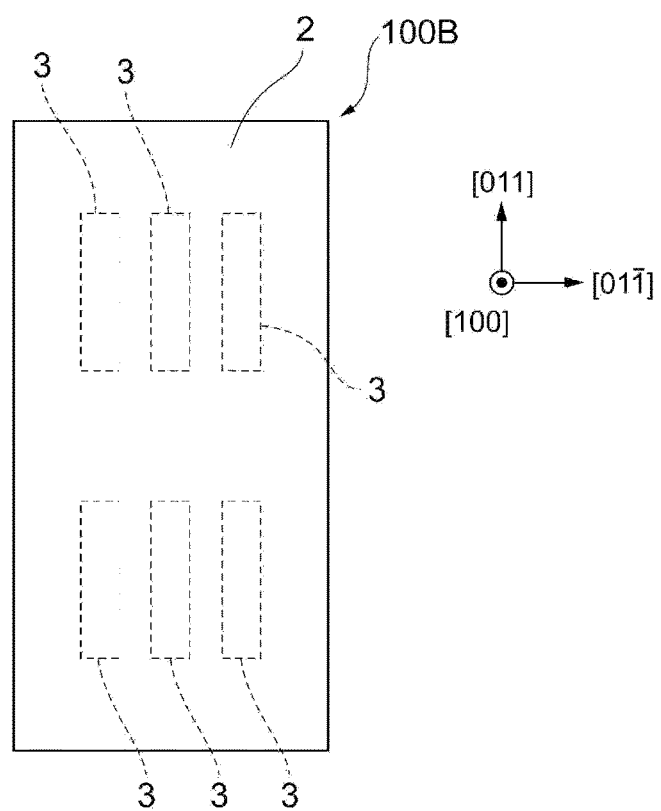
FIG. 9 is a plan view of a compound semiconductor chip according to a modification of the first embodiment of the present disclosure.

Next, a modification of this embodiment will be described with reference to FIG. 9. FIG. 9 is a plan view of a compound semiconductor chip according to a modification of the first embodiment of the present disclosure. In the following other embodiments and modifications, the same elements as those in the compound semiconductor chip 100A are denoted by the same symbols and the descriptions thereof are omitted. The matters shared with the first embodiment are not described, and only different points will be described. In particular, the same advantageous effects produced by the same structures are not mentioned in each embodiment.

A compound semiconductor chip 100B illustrated in FIG. 9 includes a plurality of (six in this modification) recesses 3. Specifically, for example, three recesses 3 are arranged in the [01-1] direction and two recesses 3 are arranged in the [011] direction. The dimensions of each recess 3 are not particularly limited. In this embodiment, for example, the short sides of the opening are 100 μm and the long sides are 400 μm. The structure of the recess 3 is the same as that of the recess 3 in the compound semiconductor chip 100A, and thus the detailed descriptions thereof are omitted.

In this structure, the compound semiconductor chip 100B can also produce the same effects as the compound semiconductor chip 100A. The total number and arrangement of the recesses 3 are not limited thereto. All the plurality of recesses may have the same dimensions or the recesses may have different dimensions.

Figure 10:
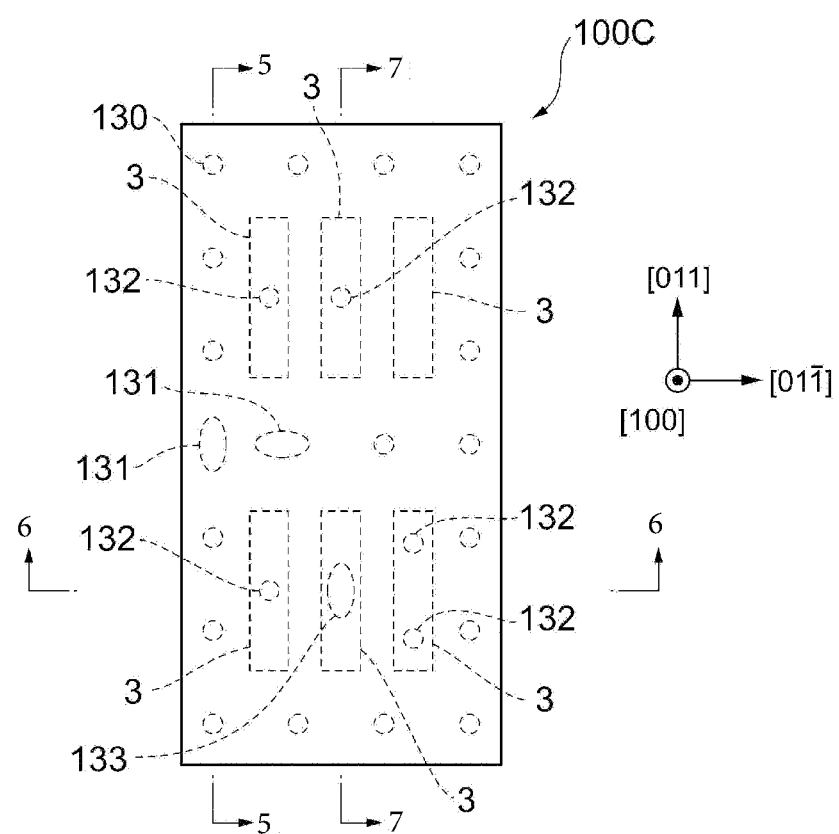
FIG. 10 is a plan view of a compound semiconductor chip according to another modification of the first embodiment of the present disclosure.
Figure 11:
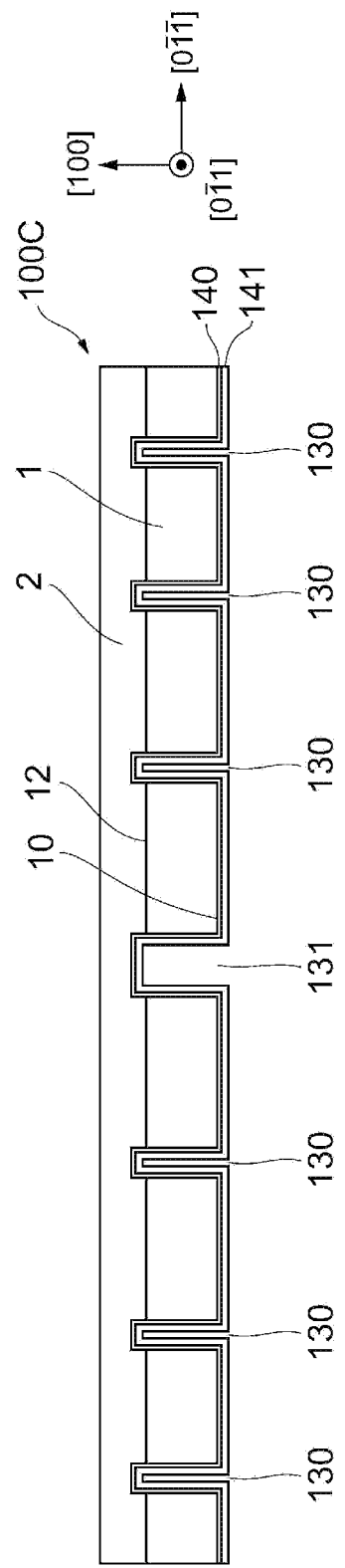
FIG. 11 is a sectional view taken along line 5-5 in FIG. 10.
Figure 12:
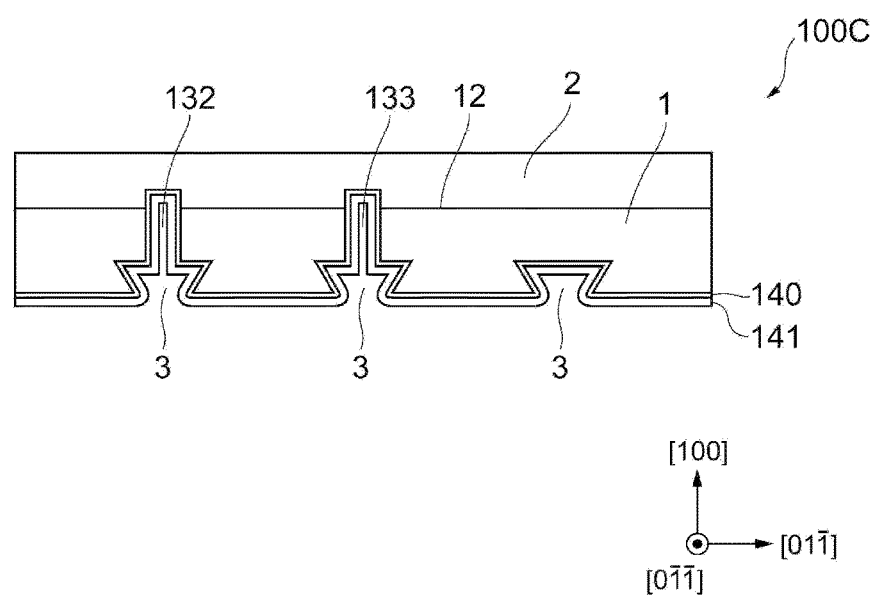
FIG. 12 is a sectional view taken along line 6-6 in FIG. 10.
Figure 13:
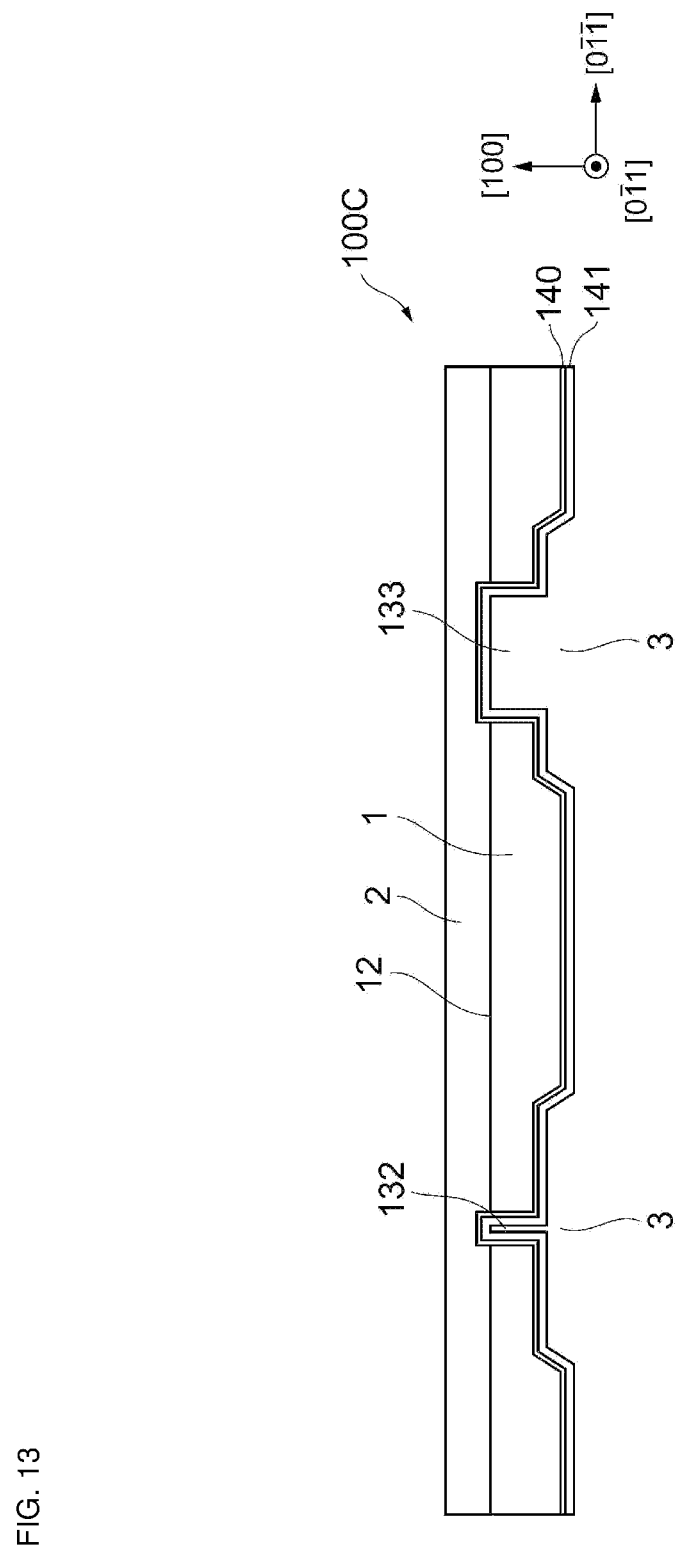
FIG. 13 is a sectional view taken along line 7-7 in FIG. 10.

Next, another modification of this embodiment will be described with reference to FIG. 10 to FIG. 14. FIG. 10 is a plan view of a compound semiconductor chip according to another modification of the first embodiment of the present disclosure. FIG. 11 is a sectional view taken along line 5-5 in FIG. 10. FIG. 12 is a sectional view taken along line 6-6 in FIG. 10. FIG. 13 is a sectional view taken along line 7-7 in FIG. 10.

A compound semiconductor chip 100C illustrated in FIG. 10 includes a plurality of via holes in addition to the structure of the compound semiconductor chip 100B. Specifically, for example, a plurality of via holes 130 and 131 are disposed in a peripheral region of the compound semiconductor substrate 1 and in a central region of the compound semiconductor substrate 1 in the [011] direction, and a plurality of via holes 132 and 133 are disposed in regions of the recesses 3. The via holes 130 to 133 are formed so as to extend through the compound semiconductor substrate 1 from the first main surface 10 toward the second main surface 12 of the compound semiconductor substrate 1 and reach the circuit formation region 2. Furthermore, electrode layers 140 and 141 are sequentially stacked on the first main surface 10 of the compound semiconductor substrate 1. Specifically, the electrode layers 140 and 141 are formed on the first main surface of the compound semiconductor substrate 1, the inner surfaces of the recesses 3, and the inner surfaces of the via holes 130 to 133. Thus, electric circuits formed in the circuit formation region 2 can be electrically connected to devices outside the compound semiconductor chip 100C through the electrode layers 140 and 141.

Figure 14:
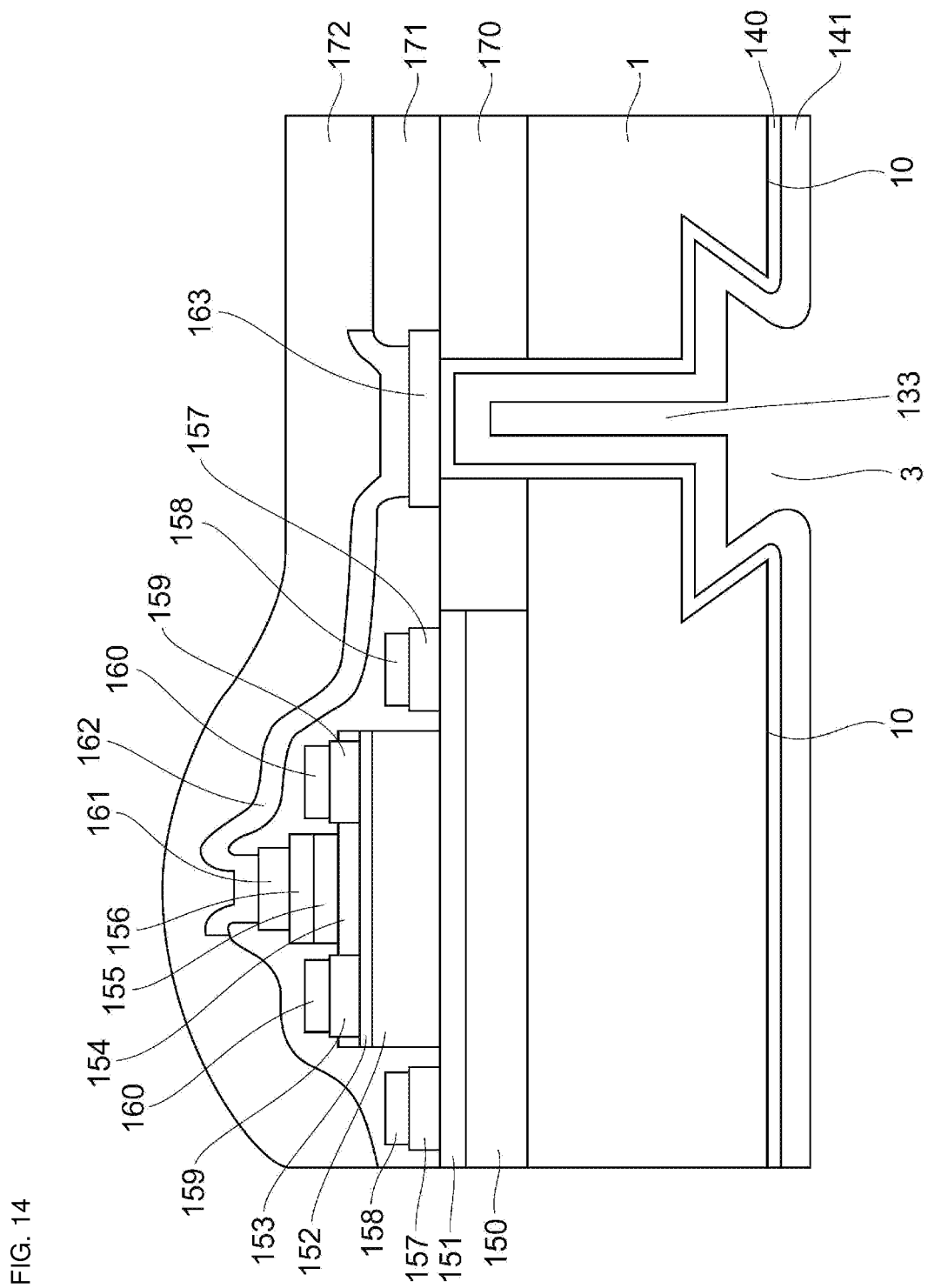
FIG. 14 is a diagram for describing the function of via holes.

FIG. 14 is a diagram for describing the function of the via holes. In FIG. 14 illustrated as an example, a HBT is formed in the circuit formation region 2 and an emitter of the HBT is electrically connected to the electrode layers 140 and 141 formed on the inner surface of the via hole 133. Specifically, a buffer layer 150 (undoped GaAs), a subcollector layer 151 (n-type GaAs), a collector layer 152 (n-type GaAs), a base layer 153 (p-type GaAs), an emitter layer 154 (n-type InGaP), a contact layer 155 (n-type GaAs), and a contact layer 156 (n-type InGaAs) are sequentially formed on the compound semiconductor substrate 1. Furthermore, a collector electrode 157 and a collector wiring line 158 are formed on the subcollector layer 151, a base electrode 159 and a base wiring line 160 are formed on the base layer 153, and an emitter electrode 161 and an emitter wiring line 162 are formed on the contact layer 156. A connection electrode 163 is also formed on the electrode layer 140 formed on the inner surface of the via hole 133. A region in which the HBT is not formed is an ion implanted electrical isolation region 170, and the electric circuit is covered with an insulating film 171 (SiN) and a passivation film 172 (SiN).

The emitter wiring line 162 extends toward the via hole 133 and is electrically connected to the connection electrode 163. Thus, the emitter layer 154 is electrically connected to the electrode layer 140 and electrode layer 141 formed on the inner surface of the via hole 133 through the contact layer 155, the contact layer 156, the emitter electrode 161, the emitter wiring line 162, and the connection electrode 163.

The structure illustrated in FIG. 14 is merely an example, and the electrode electrically connected to the electrode layer in the via hole is not limited to the emitter of the HBT. The materials for the above HBT are non-limiting examples.

Furthermore, the shape of the via hole is not particularly limited. For example, the opening of the via hole may be a perfect circle as in the via holes 130 and 132 or may be an ellipse as in the via holes 131 and 133. In this embodiment, the via holes are formed in both the region where the recesses 3 are formed in the compound semiconductor substrate and the region where the recesses 3 are not formed, but the positions at which the via holes are formed are not particularly limited.

Figure 15:
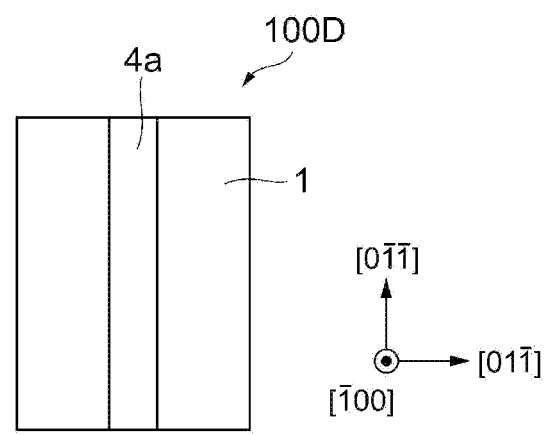
FIG. 15 is a plan view of a compound semiconductor chip according to a second embodiment of the present disclosure.
Figure 16:
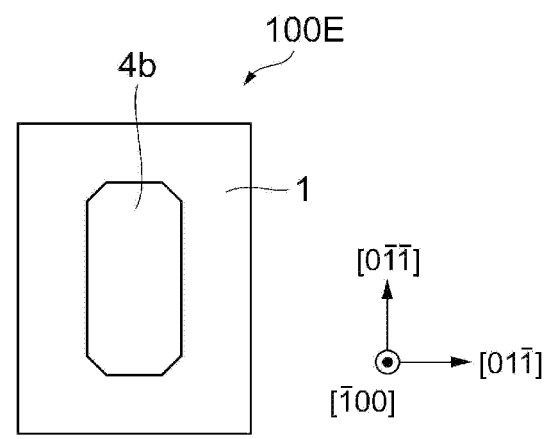
FIG. 16 is a plan view of a compound semiconductor chip according to a modification of the second embodiment of the present disclosure.
Figure 17:
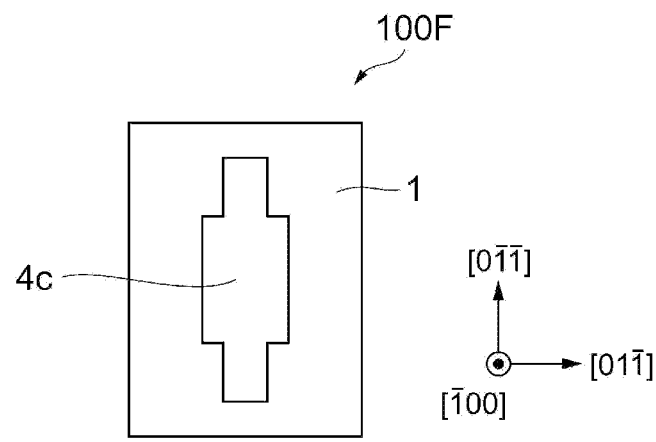
FIG. 17 is a plan view of a compound semiconductor chip according to another modification of the second embodiment of the present disclosure.

Next, a compound semiconductor chip according to a second embodiment of the present disclosure will be described with reference to FIG. 15 to FIG. 17. FIG. 15 is a plan view of a compound semiconductor chip according to a second embodiment of the present disclosure. FIG. 16 is a plan view of a compound semiconductor chip according to a modification of the second embodiment of the present disclosure. FIG. 17 is a plan view of a compound semiconductor chip according to another modification of the second embodiment of the present disclosure. FIG. 15 to FIG. 17 are plan views obtained when the compound semiconductor substrate 1 is viewed in plan from the first main surface 10. In FIG. 15 to FIG. 17, the edge line between the first main surface of the compound semiconductor substrate 1 and each of openings of the recesses 4a to 4c formed in the compound semiconductor substrate 1 is shown in a solid line.

The recesses 4a to 4c in compound semiconductor chips 100D to 100F illustrated in FIG. 15 to FIG. 17 are different from the recesses 3 in the compound semiconductor chips 100A to 100C in terms of the shape of the opening. Specifically, the opening of the recess 4a is formed in such a substantially rectangular shape that the opening reaches both end portions of the compound semiconductor substrate 1 in the [0-1-1] direction. That is, the recess 4a is a groove that extends through the compound semiconductor substrate 1 in the [0-1-1] direction. The opening of the recess 4b has a polygonal shape (an octagon in the example illustrated in FIG. 16). The opening of the recess 4c has a cross shape. In such a structure, the side surfaces corresponding to edge lines parallel to the [0-1-1] direction in the recesses 4a to 4c are inverted mesa side surfaces, and the side surfaces corresponding to edge lines parallel to the [01-1] direction are normal mesa side surfaces. Furthermore, in the openings of the recesses 4a to 4c, the total length of the edge lines parallel to the [0-1-1] direction is larger than the total length of the edge lines parallel to the [01-1] direction as in the case of the opening of the recess 3. Thus, the compound semiconductor chips 100D to 100F can produce the same effects as those of the compound semiconductor chip 100A.

The shape of the opening of the recess is not limited thereto. In the examples illustrated in FIG. 15 to FIG. 17, a single recess is formed in the compound semiconductor substrate, but different types of recesses or a plurality of recesses may be formed in the compound semiconductor substrate.

Next, a method for producing the compound semiconductor chip 100C according to another modification of the first embodiment of the present disclosure will be described with reference to FIG. 18A to FIG. 18L. FIG. 18A to FIG. 18L illustrate the procedure of a method for producing the compound semiconductor chip according to another modification of the first embodiment of the present disclosure. The drawings in FIG. 18A to FIG. 18L extend in the same direction as the sectional view taken along line 1-1 in FIG. 1. In the following description, the case where a HBT is formed in the circuit formation region is shown as an example of the electric circuit. Furthermore, for convenience of description, elements corresponding to the elements illustrated in FIG. 4A to FIG. 4E or FIG. 14 are denoted by the same symbols as those used in FIG. 4A to FIG. 4E or FIG. 14, and the descriptions thereof are omitted.

Figure 18A:
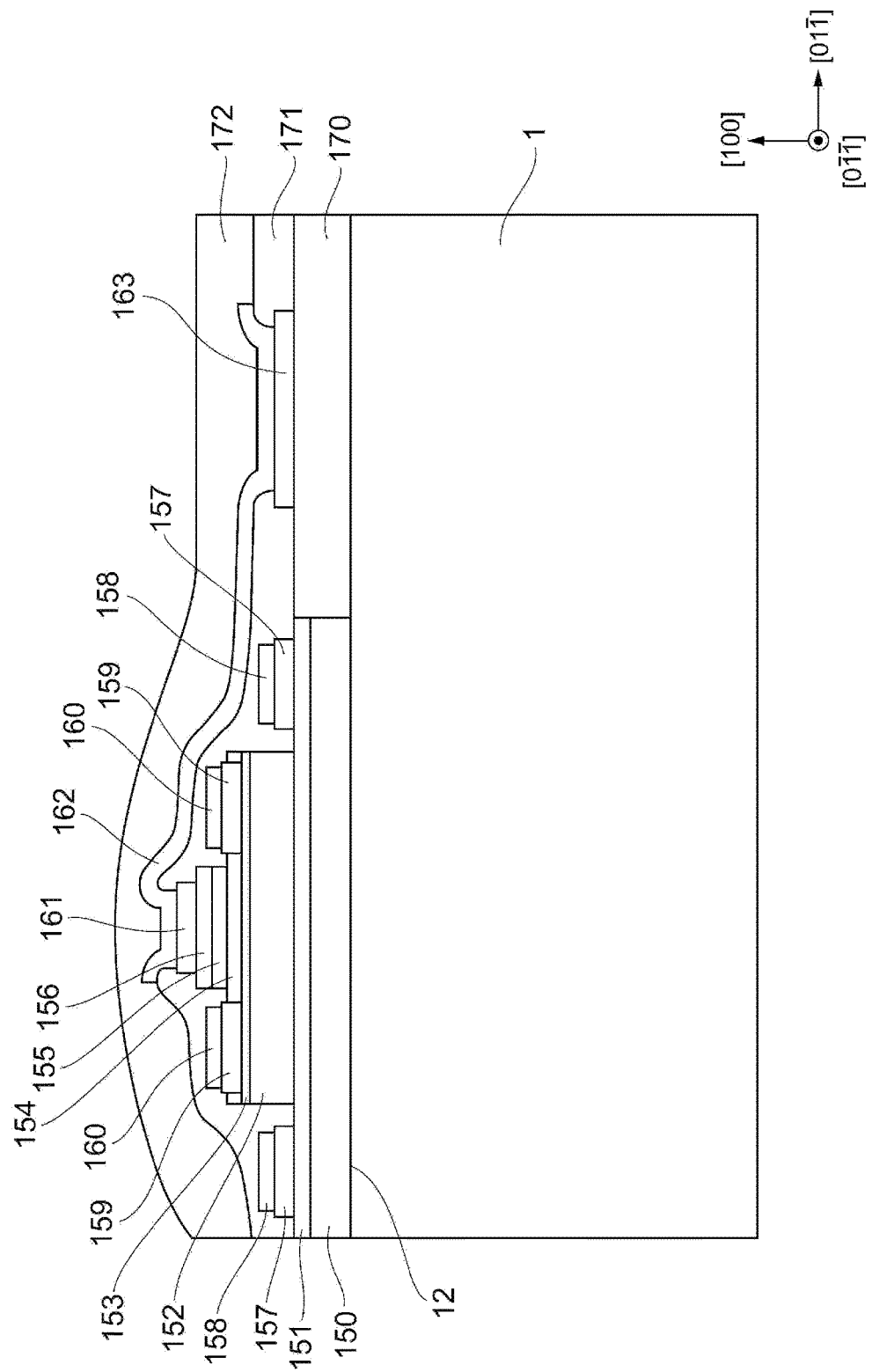
FIG. 18A illustrates the procedure of a production method of the compound semiconductor chip according to another modification of the first embodiment of the present disclosure.

As illustrated in FIG. 18A, a HBT is formed in a circuit formation region on the compound semiconductor substrate 1 by a typical semiconductor process.

Figure 18B:
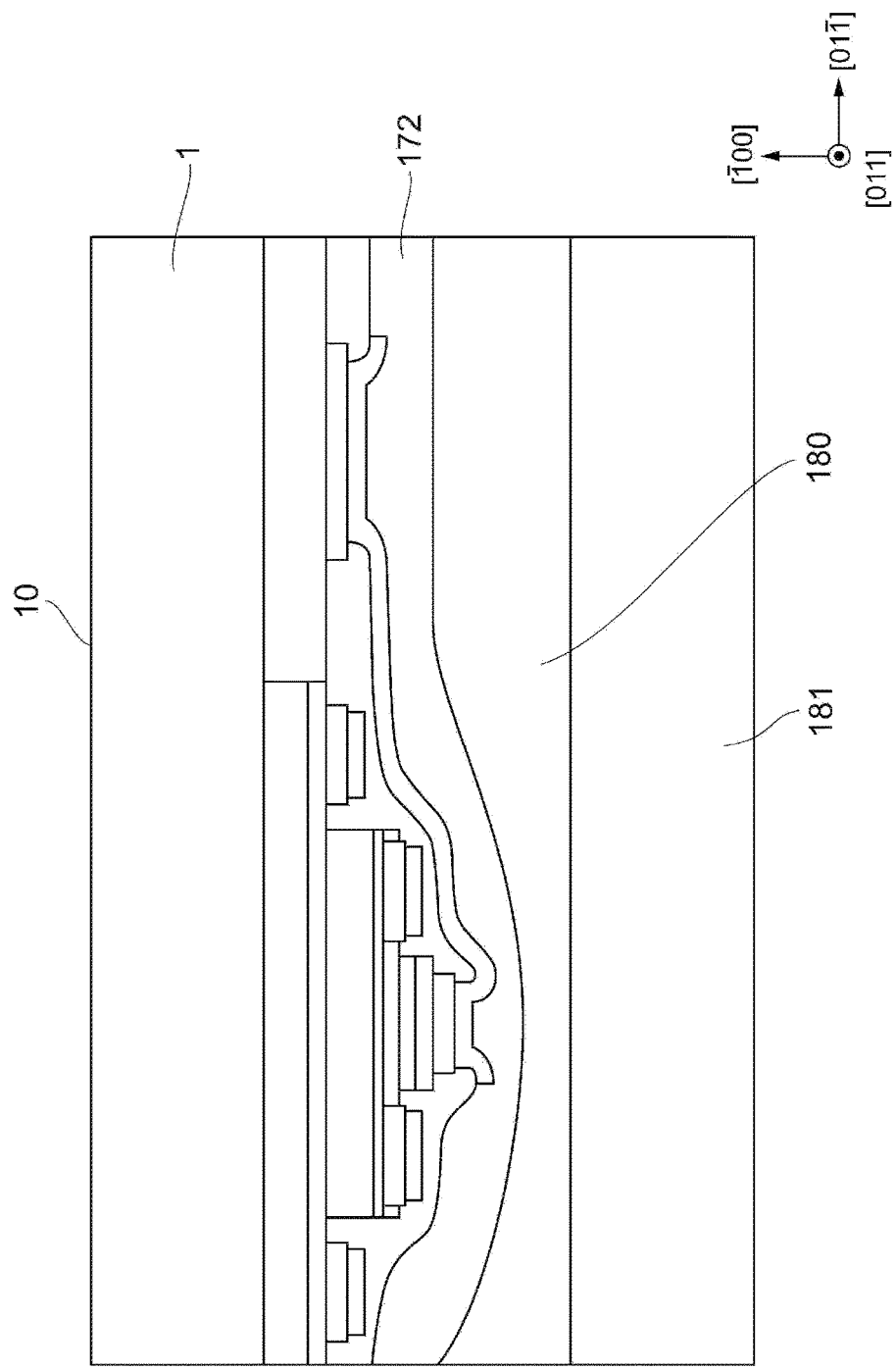
FIG. 18B illustrates the procedure of a production method of the compound semiconductor chip according to another modification of the first embodiment of the present disclosure.

As illustrated in FIG. 18B, the passivation film 172 is then bonded to a sapphire substrate 181 with a wax 180 interposed therebetween. The compound semiconductor substrate 1 is ground to expose the first main surface 10 of the compound semiconductor substrate 1. The thickness of the compound semiconductor substrate 1 is, for example, about 75 µm.

Figure 18C:
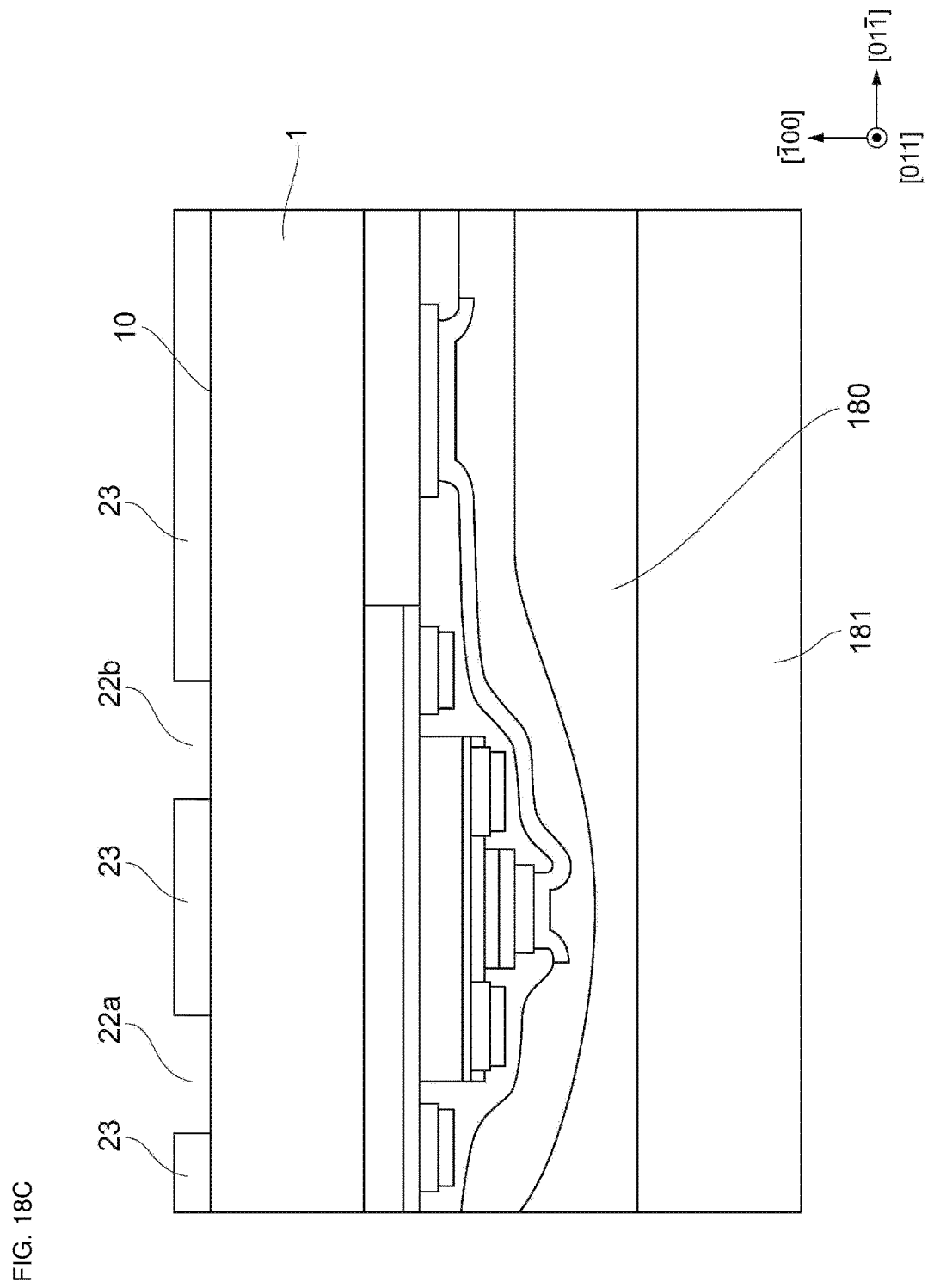
FIG. 18C illustrates the procedure of a production method of the compound semiconductor chip according to another modification of the first embodiment of the present disclosure.

As illustrated in FIG. 18C, a photoresist 23 having cavities 22a and 22b is then formed on the first main surface 10 of the compound semiconductor substrate 1. The photoresist 23 serves as a mask in a recess-forming step.

Figure 18D:
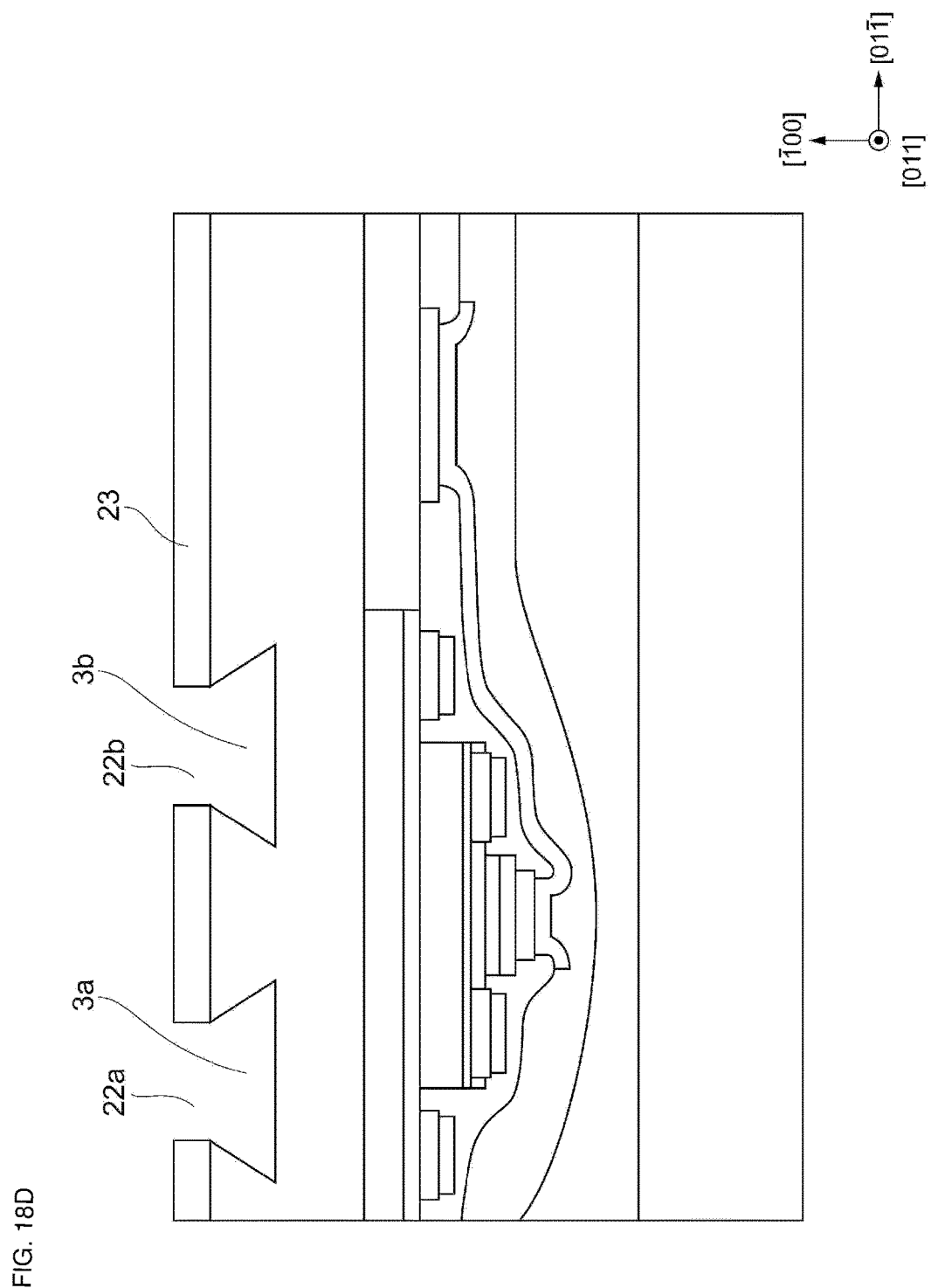
FIG. 18D illustrates the procedure of a production method of the compound semiconductor chip according to another modification of the first embodiment of the present disclosure.

As illustrated in FIG. 18D, recesses 3a and 3b are then formed under the cavities 22a and 22b by performing wet etching using the photoresist 23 as a mask. The composition of a wet etchant is, for example, phosphoric acid:hydrogen peroxide solution:water=1:2:40 (volume ratio). The crystal orientation dependence of the compound semiconductor is the same as that in the description in FIG. 4A to FIG. 4E and thus the description thereof is omitted.

As illustrated in FIG. 18E, the photoresist 23 is then removed.

Figure 18F:
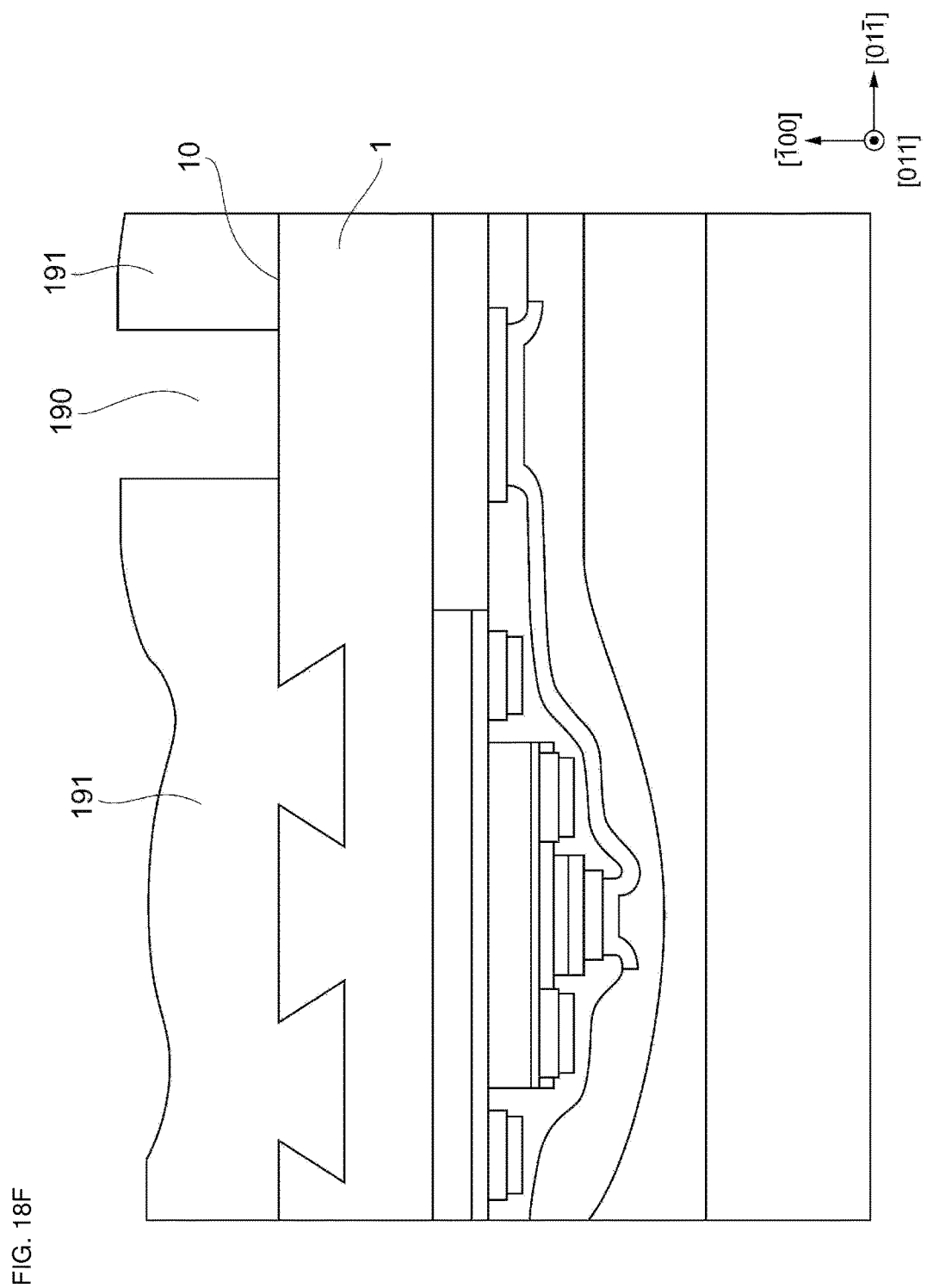
FIG. 18F illustrates the procedure of a production method of the compound semiconductor chip according to another modification of the first embodiment of the present disclosure.

As illustrated in FIG. 18F, a photoresist 191 having a cavity 190 is then formed on the first main surface 10 of the compound semiconductor substrate 1. The photoresist 191 serves as a mask in a via hole-forming step.

Figure 18G:
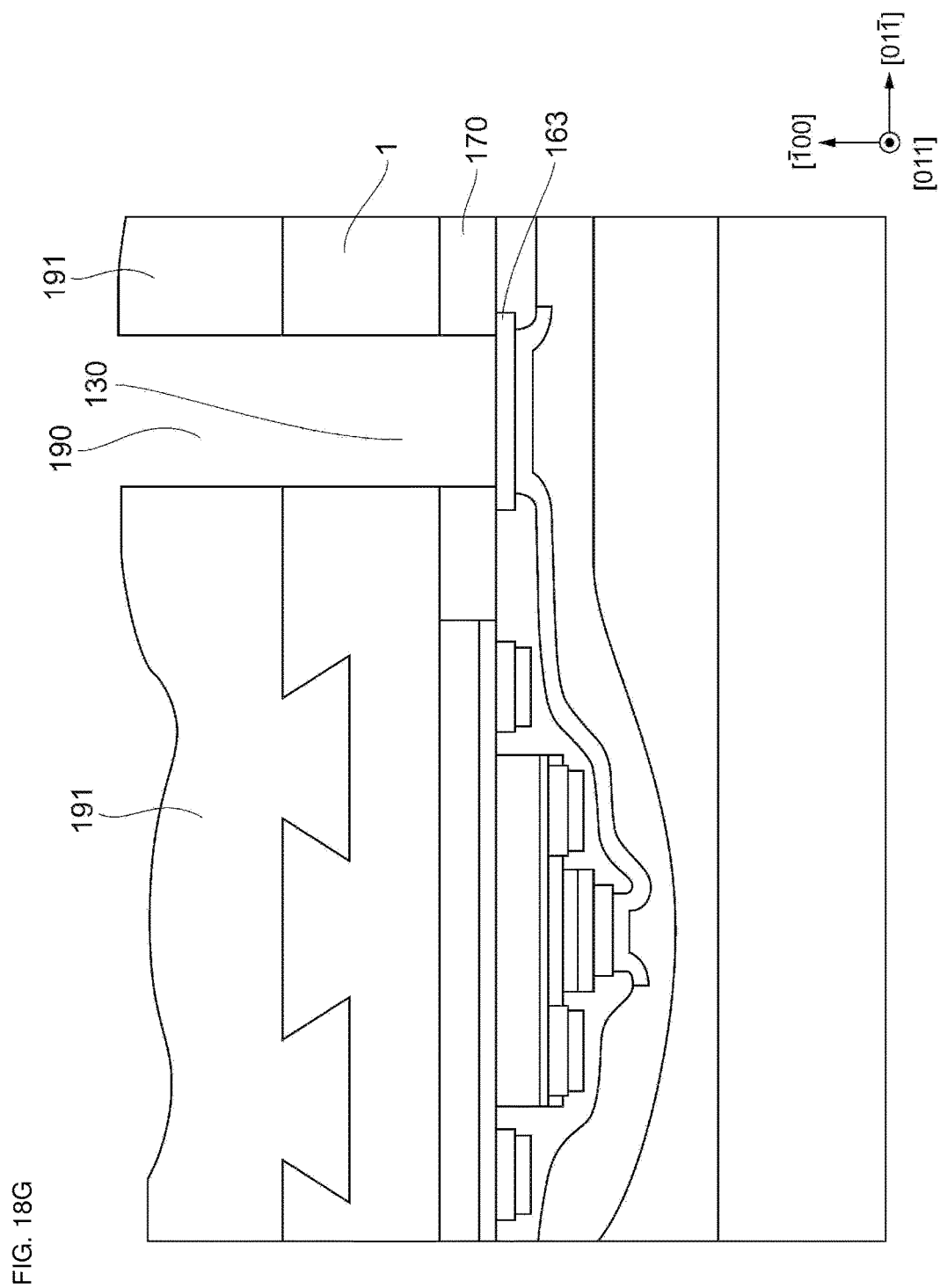
FIG. 18G illustrates the procedure of a production method of the compound semiconductor chip according to another modification of the first embodiment of the present disclosure.

As illustrated in FIG. 18G, a via hole 130 is then formed under the cavity 190 by performing anisotropic dry etching using the photoresist 191 as a mask. The via hole 130 extends through the compound semiconductor substrate 1 and the ion implanted electrical isolation region 170 and reaches the connection electrode 163.

As illustrated in FIG. 18H, the photoresist 191 is then removed.

Figure 18I:
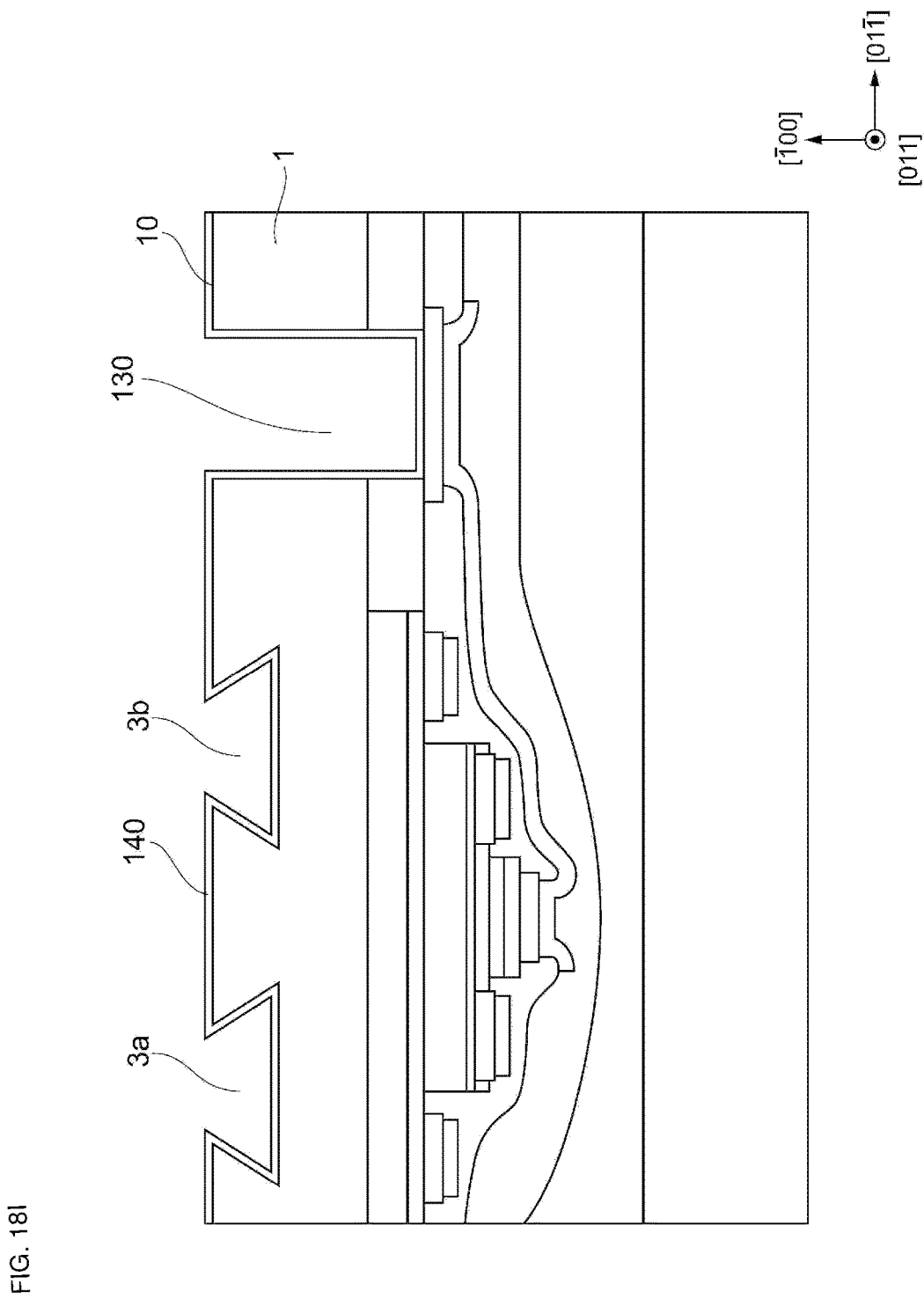
FIG. 18I illustrates the procedure of a production method of the compound semiconductor chip according to another modification of the first embodiment of the present disclosure.

As illustrated in FIG. 18I, an electrode layer 140 is then formed on the entire first main surface 10 of the compound semiconductor substrate 1, the entire inner surfaces of the recesses 3a and 3b, and the entire inner surface of the via hole 130. The electrode layer 140 is formed by, for example, electroless plating. For example, the electrode layer 140 is formed of Pd and has a thickness of about 0.05 µm.

Figure 18J:
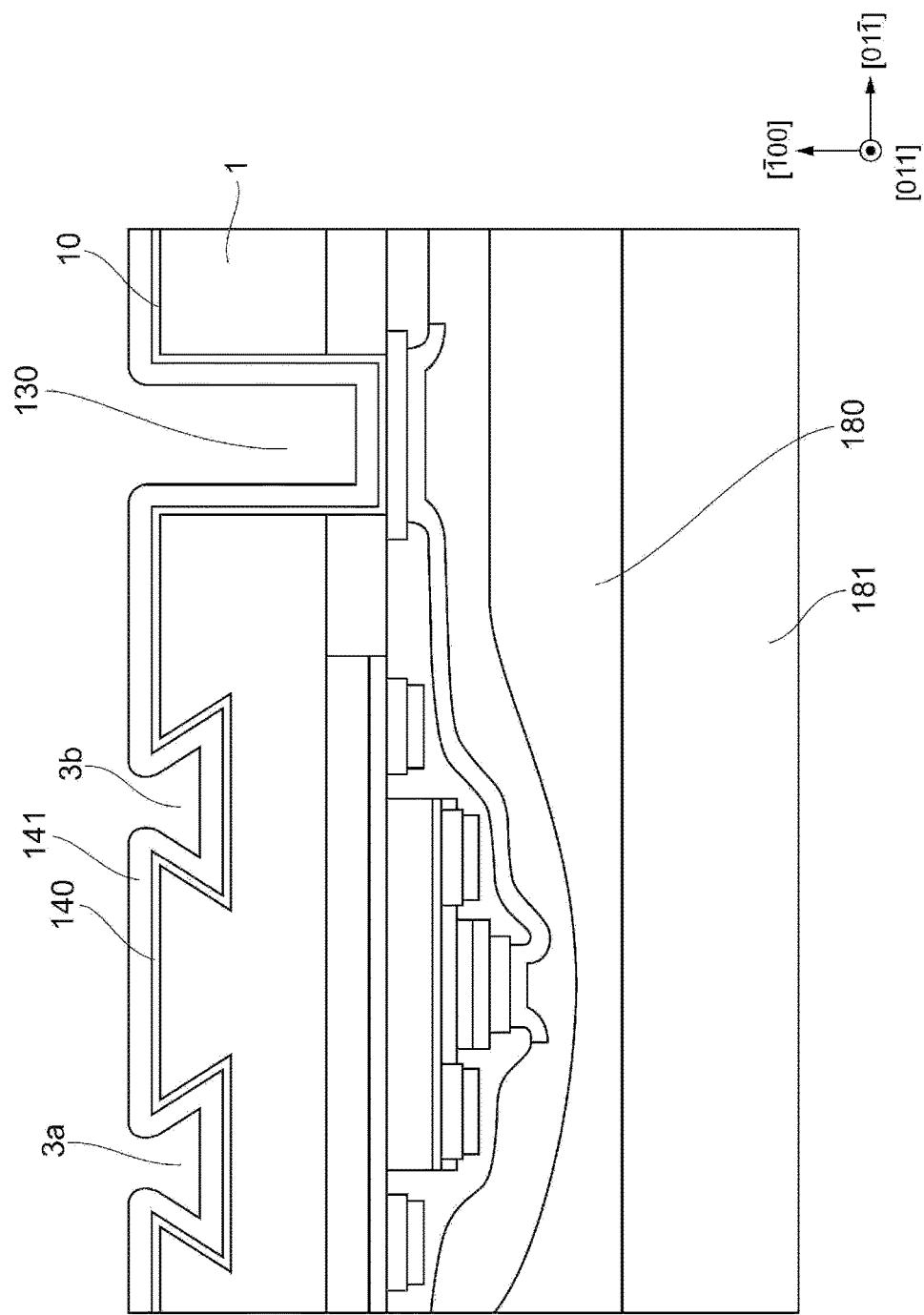
FIG. 18J illustrates the procedure of a production method of the compound semiconductor chip according to another modification of the first embodiment of the present disclosure.

As illustrated in FIG. 18J, an electrode layer 141 is stacked on the electrode layer 140. The electrode layer 141 is formed by, for example, electroplating. For example, the electrode layer 141 is formed of Au and has a thickness of about 4.5 µm.

Figure 18K:
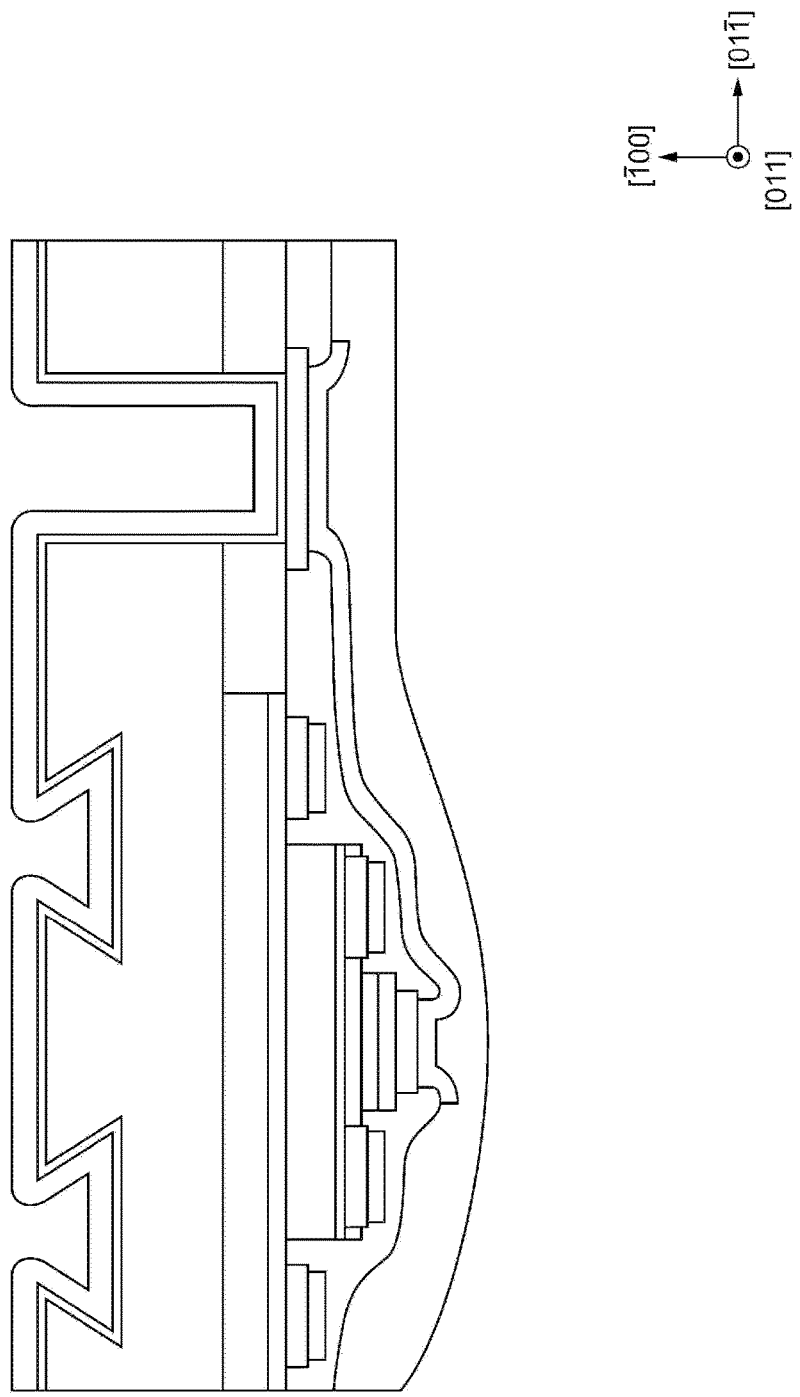
FIG. 18K illustrates the procedure of a production method of the compound semiconductor chip according to another modification of the first embodiment of the present disclosure.

As illustrated in FIG. 18K, the wax 180 and the sapphire substrate 181 are then removed.

Figure 18L:
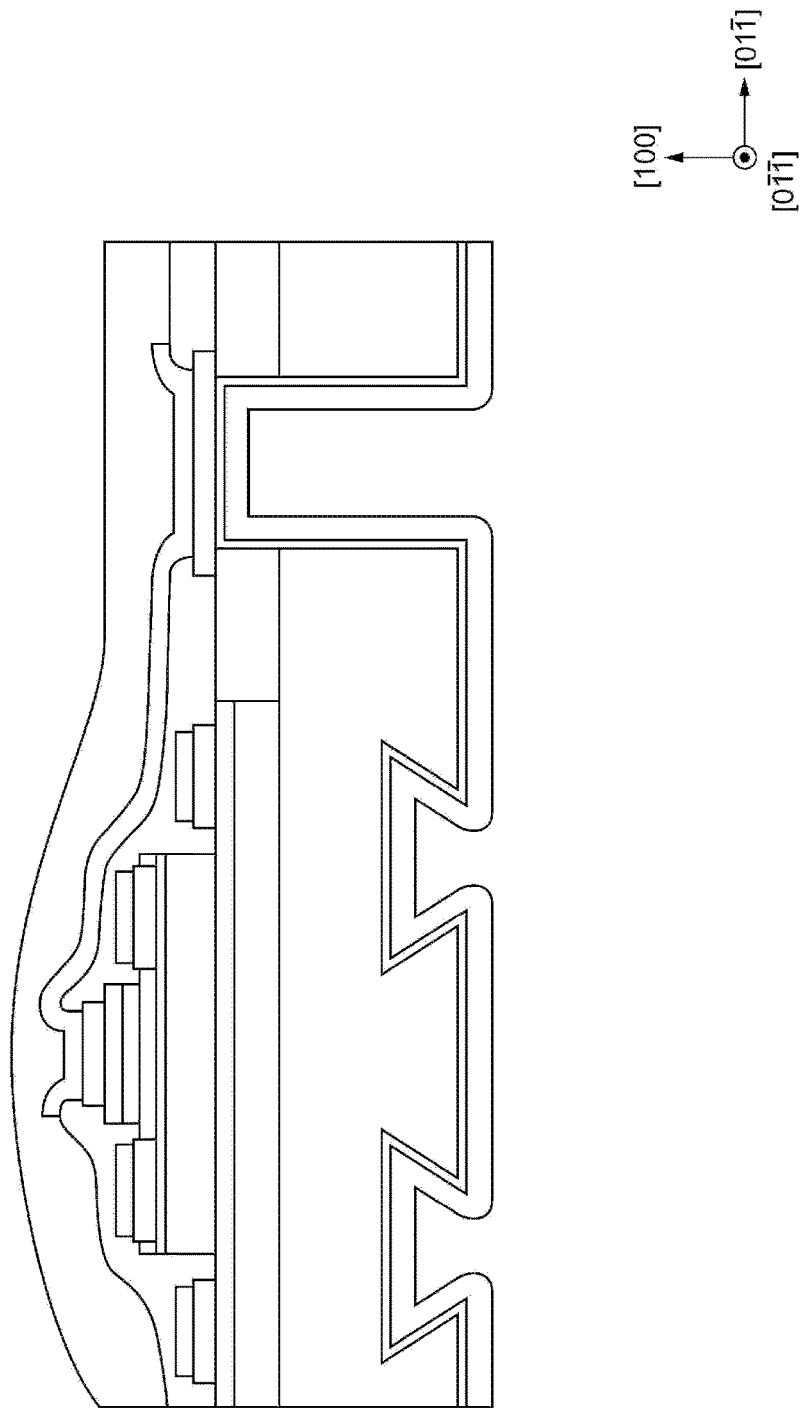
FIG. 18L illustrates the procedure of a production method of the compound semiconductor chip according to another modification of the first embodiment of the present disclosure.

As illustrated in FIG. 18L, the wafer is then turned upside down and, for example, cut with a dicing machine to obtain compound semiconductor chips.

The compound semiconductor chip 100C including recesses and a via hole in the compound semiconductor substrate 1 can be produced by the above-described production method. The method for producing a compound semiconductor chip is not limited thereto.

Figure 19:
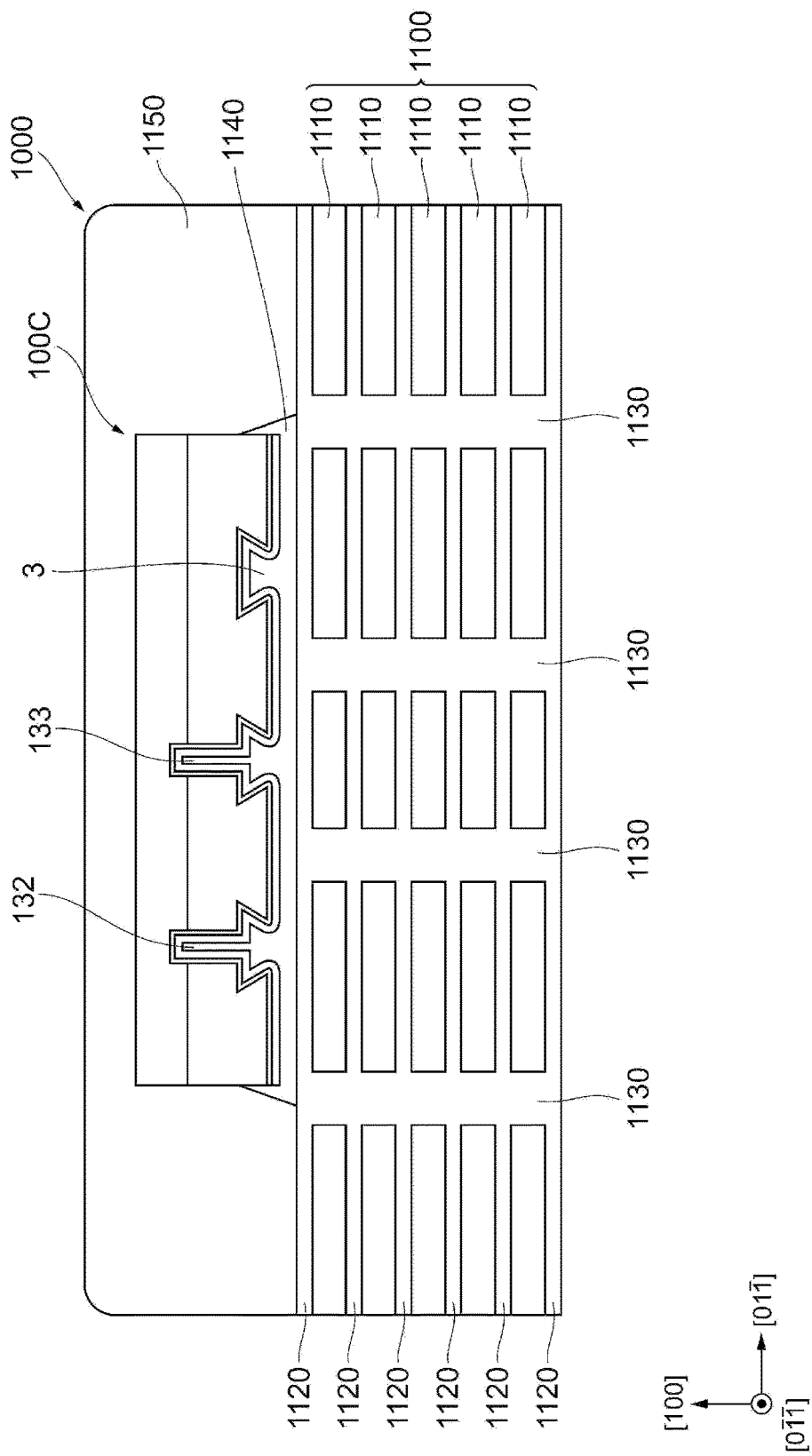
FIG. 19 is a sectional view of a power amplifier module obtained by mounting the compound semiconductor chip according to another modification of the first embodiment of the present disclosure.

Next, a power amplifier module obtained by mounting the compound semiconductor chip will be described with reference to FIG. 19. FIG. 19 is a sectional view of a power amplifier module obtained by mounting the compound semiconductor chip according to another modification of the first embodiment of the present disclosure. A module obtained by mounting any of the compound semiconductor chips 100A to 100F may be used in any application. For example, such a module may be included in mobile communication devices such as cellular phones and used as a power amplifier module that amplifies transmission signals. A power amplifier module 1000 illustrated in FIG. 19 extends in the same direction as the sectional view taken along line 6-6 in FIG. 10. In FIG. 19, the compound semiconductor chip 100C is illustrated as an example of compound semiconductor chips, but the compound semiconductor chips according to other modifications and embodiments can also be mounted. Although not illustrated in FIG. 19, for example, a bonding wire that transmits electrical signals, a surface mount device (SMD) such as a capacitor, an inductor, or a resistor, and a silicon integrated circuit (IC) may be mounted on the power amplifier module 1000.

In the power amplifier module 1000, the compound semiconductor chip 100C is mounted on a module substrate 1100. The module substrate 1100 includes insulating substrates 1110 and conductive layers 1120 alternately laminated in the [100] direction. The insulating substrates 1110 are formed of, for example, glass epoxy resin. The conductive layers 1120 are formed of, for example, Cu. Furthermore, via holes 1130 are formed so as to extend through the module substrate 1100 in the direction. The via holes 1130 are filled with, for example, Cu.

The compound semiconductor chip 100C is bonded to the main surface of the module substrate 1100 using an adhesive 1140. The adhesive 1140 is interposed between the first main surface of the compound semiconductor substrate 1 in the compound semiconductor chip 100C and the module substrate 1100. The recess 3 and the via holes 132 and 133 formed in the compound semiconductor substrate 1 are filled with the adhesive 1140. The compound semiconductor chip 100C is covered with a cured resin 1150.

The adhesive 1140 has a thermal conductivity (e.g., about 140 W/mK) higher than the thermal conductivity (e.g., about 46 W/mK) of the compound semiconductor substrate 1. Thus, as described using FIG. 8A, heat generated by the electric circuit readily conducts to the module substrate 1100. This improves the heat dissipation properties of the power amplifier module 1000 obtained by mounting the compound semiconductor chip 100C.

The module obtained by mounting any of the compound semiconductor chips 100A to 100F is not limited to the power amplifier module. The compound semiconductor chips 100A to 100F may be included in any other electronic component modules.

The exemplary embodiments of the present disclosure have been described. In the compound semiconductor chips 100A to 100F, the recess 3 formed in the compound semiconductor substrate 1 includes the side surfaces 33a that form an acute angle with the bottom surface 32 and the side surfaces 33b that form an obtuse angle with the bottom surface 32. The total length of the edge lines between the first main surface 10 of the compound semiconductor substrate 1 and the side surfaces 33a is larger than the total length of the edge lines between the first main surface 10 and the side surfaces 33b. Thus, the recess 3 is formed such that the inverted mesa side surfaces 33a are longer than the normal mesa side surfaces 33b. Therefore, the compound semiconductor substrate 1 has higher adhesive strength between the compound semiconductor substrate and the module substrate than the substrate of Comparative Example A or Comparative Example B, which improves the peeling resistance.

The side surfaces 33a extend in the [011] direction of the compound semiconductor substrate 1, and the side surfaces 33b extend in the [01-1] direction. Thus, the inverted mesa side surfaces 33a and the normal mesa side surfaces 33b can be formed by using the crystal orientation dependence of the compound semiconductor substrate 1. Therefore, the compound semiconductor substrate 1 has higher peeling resistance than the substrate of Comparative Example A or Comparative Example B without performing complicated processes.

Inside the recess 3, the angle θ between the bottom surface 32 and the side surfaces 33a may be θ=54.7±4 degrees, and the angle φ between the bottom surface 32 and the side surfaces 33b may be φ=180−θ degrees.

The depth D of the recess 3 may be a depth smaller than or equal to the thickness of the compound semiconductor substrate 1.

The material for the compound semiconductor substrate 1 is not particularly limited, and the compound semiconductor substrate 1 may be formed of, for example, GaAs or InP.

In the compound semiconductor chip 100C, the compound semiconductor substrate 1 includes the via holes 130 to 133 that extend from the first main surface 10 to the second main surface 12. Thus, electric circuits can be electrically connected to devices outside the compound semiconductor chip 100C through the electrode layers 140 and 141 formed on the inner surfaces of the via holes 130 to 133.

In the power amplifier module obtained by mounting the compound semiconductor chips 100A to 100F on the module substrate, the thermal conductivity of the adhesive interposed between the compound semiconductor substrate 1 and the module substrate is higher than the thermal conductivity of the compound semiconductor substrate 1. Thus, heat generated by the electric circuit readily conducts to the module substrate. Therefore, the power amplifier module has better heat dissipation properties than that using the substrate of Comparative Example A or Comparative Example B.

The positioning of the amplifying device formed in the circuit formation region 2 is not particularly limited. For example, the amplifying device may be formed such that the substantial center of the amplifying device in the [01-1] direction is located in a region corresponding to the opening 31 of the recess 3. This further improves the heat dissipation properties of the power amplifier module.

The embodiments described above are provided to enable easy understanding of the present disclosure, and the embodiments are not to be interpreted as limiting the present disclosure. The present disclosure can be modified or improved without departing from the gist of the disclosure and equivalents to the present disclosure are also included in the present disclosure. In other words, appropriate design modifications made to the embodiments by those skilled in the art are also included in the scope of the present disclosure so long as the modifications have the features of the present disclosure. For example, the elements included in the embodiments and the arrangements, materials, conditions, shapes, sizes and the like of the elements are not limited to those exemplified in the embodiments and can be appropriately changed. In addition, the elements included in the embodiments can be combined as much as technically possible and such combined elements are also included in the scope of the present disclosure so long as the combined elements have the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A compound semiconductor substrate comprising:
    a first main surface parallel to a first direction and a second direction perpendicular to the first direction;
    a second main surface located on a side opposite to the first main surface; and
    a recess formed from the first main surface toward the second main surface,
    wherein the recess has an opening formed in the first main surface, a bottom surface facing the opening, and a plurality of side surfaces located between the opening and the bottom surface so as to define the recess,
    the plurality of side surfaces include:
        at least one first side surface that extends in the first direction and forms an angle of θ (0<θ<90) degrees with the bottom surface in the recess; and
        at least one second side surface that extends in the second direction and forms an angle of φ (90<φ<180) degrees with the bottom surface in the recess, and
    a total length of edge lines between the first main surface and the at least one first side surface is larger than a total length of edge lines between the first main surface and the at least one second side surface.

2. The compound semiconductor substrate according to claim 1,
    wherein the first direction is parallel to a [011] direction or a [0-1-1] direction in a crystal orientation of the compound semiconductor substrate, and
    the second direction is parallel to a [01-1] direction or a [0-11] direction in a crystal orientation of the compound semiconductor substrate.

3. The compound semiconductor substrate according to claim 2,
    wherein θ is 54.7±4 and φ is 180−θ.

4. The compound semiconductor substrate according to claim 2,
    wherein a distance from the opening to the bottom surface of the recess is shorter than or equal to a thickness of the compound semiconductor substrate.

5. The compound semiconductor substrate according to claim 4,
    wherein the compound semiconductor substrate is formed of GaAs or InP.

6. The compound semiconductor substrate according to claim 4,
    wherein the compound semiconductor substrate has a via hole that extends through the compound semiconductor substrate from the first main surface to the second main surface.

7. A power amplifier module comprising:
    the compound semiconductor substrate according to claim 3;
    an amplifying device formed on the second main surface of the compound semiconductor substrate;
    a module substrate on which the compound semiconductor substrate is mounted; and
    an adhesive interposed between the compound semiconductor substrate and the module substrate such that the recess is filled with the adhesive, wherein the adhesive has a thermal conductivity higher than that of the compound semiconductor substrate.

8. The power amplifier module according to claim 7, wherein the amplifying device is formed such that a substantial center of the amplifying device, where a largest amount of heat is generated, is located in a region on the second main surface, the region corresponding to the opening of the recess.

9. A power amplifier module comprising:
the compound semiconductor substrate according to claim 5;
an amplifying device formed on the second main surface of the compound semiconductor substrate;
a module substrate on which the compound semiconductor substrate is mounted; and
an adhesive interposed between the compound semiconductor substrate and the module substrate such that the recess is filled with the adhesive,
wherein the adhesive has a thermal conductivity higher than that of the compound semiconductor substrate.

10. The power amplifier module according to claim 9, wherein the amplifying device is formed such that a substantial center of the amplifying device, where a largest amount of heat is generated, is located in a region on the second main surface, the region corresponding to the opening of the recess.

11. A power amplifier module comprising:
the compound semiconductor substrate according to claim 6;
an amplifying device formed on the second main surface of the compound semiconductor substrate;
a module substrate on which the compound semiconductor substrate is mounted; and
an adhesive interposed between the compound semiconductor substrate and the module substrate such that the recess is filled with the adhesive,
wherein the adhesive has a thermal conductivity higher than that of the compound semiconductor substrate.

12. The power amplifier module according to claim 11, wherein the amplifying device is formed such that a substantial center of the amplifying device, where a largest amount of heat is generated, is located in a region on the second main surface, the region corresponding to the opening of the recess.

13. The compound semiconductor substrate according to claim 1,
wherein $\theta$ is 54.7±4 and $\phi$ is 180−$\theta$.

14. The compound semiconductor substrate according to claim 1,
wherein a distance from the opening to the bottom surface of the recess is shorter than or equal to a thickness of the compound semiconductor substrate.

15. The compound semiconductor substrate according to claim 14,
wherein the compound semiconductor substrate is formed of GaAs or InP.

16. The compound semiconductor substrate according to claim 14,
wherein the compound semiconductor substrate has a via hole that extends through the compound semiconductor substrate from the first main surface to the second main surface.

17. A power amplifier module comprising:
the compound semiconductor substrate according to claim 15;
an amplifying device formed on the second main surface of the compound semiconductor substrate;
a module substrate on which the compound semiconductor substrate is mounted; and
an adhesive interposed between the compound semiconductor substrate and the module substrate such that the recess is filled with the adhesive,
wherein the adhesive has a thermal conductivity higher than that of the compound semiconductor substrate.

18. The power amplifier module according to claim 17, wherein the amplifying device is formed such that a substantial center of the amplifying device, where a largest amount of heat is generated, is located in a region on the second main surface, the region corresponding to the opening of the recess.

19. A power amplifier module comprising:
the compound semiconductor substrate according to claim 16;
an amplifying device formed on the second main surface of the compound semiconductor substrate;
a module substrate on which the compound semiconductor substrate is mounted; and
an adhesive interposed between the compound semiconductor substrate and the module substrate such that the recess is filled with the adhesive,
wherein the adhesive has a thermal conductivity higher than that of the compound semiconductor substrate.

20. The power amplifier module according to claim 19, wherein the amplifying device is formed such that a substantial center of the amplifying device, where a largest amount of heat is generated, is located in a region on the second main surface, the region corresponding to the opening of the recess.

* * * * *